United States Patent
Orihashi et al.

(10) Patent No.: US 7,280,611 B2
(45) Date of Patent: Oct. 9, 2007

(54) NONLINEAR DISTORTION COMPENSATING DEVICE

(75) Inventors: Masayuki Orihashi, Chiba (JP); Yutaka Murakami, Kanagawa (JP); Shinichir Takabayashi, Kanagawa (JP); Akihiko Matsuoka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 769 days.

(21) Appl. No.: 10/410,323

(22) Filed: Apr. 9, 2003

(65) Prior Publication Data

US 2003/0228856 A1 Dec. 11, 2003

(30) Foreign Application Priority Data

Apr. 10, 2002 (JP) .............................. 2002-107626

(51) Int. Cl.
- H04K 1/02 (2006.01)
- H04L 25/03 (2006.01)
- H03D 1/04 (2006.01)
- H04B 1/04 (2006.01)

(52) U.S. Cl. ................. 375/296; 375/346; 455/226.1; 455/118

(58) Field of Classification Search ........ 375/296–298, 375/340, 346; 330/149; 455/63.1, 118, 455/226.1
See application file for complete search history.

(56) References Cited

U.S. PATENT DOCUMENTS

| | | | | |
|---|---|---|---|---|
| 4,700,151 A | * | 10/1987 | Nagata | 332/123 |
| 5,148,448 A | * | 9/1992 | Karam et al. | 375/298 |
| 5,396,190 A | * | 3/1995 | Murata | 330/149 |
| 5,699,383 A | * | 12/1997 | Ichiyoshi | 375/297 |
| 6,091,941 A | * | 7/2000 | Moriyama et al. | 455/126 |
| 6,388,515 B1 | * | 5/2002 | Nishida | 330/52 |
| 6,751,272 B1 | * | 6/2004 | Burns et al. | 375/340 |
| 6,751,273 B1 | * | 6/2004 | Park et al. | 375/346 |
| 7,088,968 B2 | * | 8/2006 | Zipper | 455/126 |
| 2001/0005402 A1 | * | 6/2001 | Nagatani et al. | 375/296 |
| 2003/0042978 A1 | * | 3/2003 | Hsu et al. | 330/149 |
| 2003/0067995 A1 | * | 4/2003 | Matsuoka et al. | 375/296 |
| 2005/0213685 A1 | * | 9/2005 | Takabayashi et al. | 375/296 |
| 2006/0105715 A1 | * | 5/2006 | Kodani et al. | 455/63.1 |

FOREIGN PATENT DOCUMENTS

| | | |
|---|---|---|
| JP | 09-153849 | 6/1997 |
| JP | 09-233145 | 9/1997 |
| JP | 2000-278190 | 10/2000 |

* cited by examiner

*Primary Examiner*—Mohammed Ghayour
*Assistant Examiner*—Lawrence Williams
(74) *Attorney, Agent, or Firm*—RatnerPrestia

(57) ABSTRACT

A nonlinear distortion compensating device splits its operation into two processes. One is a compensation & amplification process for providing a receipt signal with a distortion compensating calculation and amplification before outputting the signal with phase and amplitude compensated. The other is an environmentally adapting process for modulating the signal demodulated from the input signal. Then in this process, a distortion estimating updater estimates a distortion amount using the modulated signal and a feed back signal of parts of the output supplied from the distortion compensating calculator, and updates a distortion compensating coefficient stored in the distortion compensating calculator.

72 Claims, 18 Drawing Sheets

NONLINEAR DISTORTION COMPENSATING DEVICE

FIELD OF THE INVENTION

The present invention relates to a nonlinear distortion compensating device which compensates a transmitting system of digital radio communication for distortion, and it also relates to a transmitting apparatus using the same device.

BACKGROUND OF THE INVENTION

The technique of digital radio communication has been developed, and sophisticated modulating methods are adopted in the radio communication. For instance, the digital TV broadcasting adopts the following system in order to expand a service area: as shown in FIG. 1, a signal transmitted from transmitter station 10 is received by receiver stations 12, 13 via relay station 11. Relay station 11 is formed of an amplifier and an antenna in order to receive an RF signal from transmitter station 10 and amplify it before redelivering the RF signal at the same or different frequency. Such relay station 11 is strongly required to be highly efficient between receiving and redelivering the signal in addition to maintaining of linearity and frequency characteristics. For improving the linearity, distortion compensation techniques are available, and a pre-distortion method among others draws attention due to its high performance.

However, a conventional pre-distortion technique tends to have a greater delay because it uses a base-band signal as a reference signal, so that this technique does not suit for relay devices. A signal in IF band can be used as a reference signal in order to reduce the delay; however, this case does not satisfy the performance required to the relay device discussed above.

SUMMARY OF THE INVENTION

The present invention addresses the foregoing problem and aims to provide a relay device having less delay. To achieve this aim, the present invention improves a structure of the conventional relay station, i.e., the following two systems are prepared independently in the relay station: (a) a compensation and amplification processing system that compensates an input signal for distortion, and (b) an environmental adaptive processing system that detects a distortion component of an output signal and processes it in an adaptive manner.

According to the present invention, a distortion amount is calculated from an input signal. Then a distortion amount for calculating and updating a distortion is estimated. A compensation and amplification processing system is provided that compensates an input signal for distortion, and an environmental adaptive processing system is provided that detects a distortion component of an output signal and processes it in an adaptive manner. The structure discussed above obtains a distortion compensating performance having less delay and high accuracy.

Another aspect of the present invention is to update a distortion compensating coefficient by estimating a distortion amount using an input base-band signal and a feedback base-band signal. Error components are compared using the base-band signals, so that the distortion can be compensated at a high accuracy.

Still another aspect of the present invention is to produce a reference signal free from an error component such as delay dispersion, and a distortion compensation is carried out using this reference signal, which is produced by the following method: demodulate a distortion-compensated input signal, and then produce a reference base-band signal using this demodulated signal. Convert parts of the distortion-compensated input signal into a feedback base-band signal, and estimate a distortion amount using the reference base-band signal and the feedback base-band signal, and update the distortion compensating coefficient.

Yet another aspect of the present invention is to remove error factors such as a frequency error generated between an input signal and a demodulator, thereby obtaining a highly accurate compensation result. The error factors can be removed by the following method: estimate a frequency error from a decoded input signal having undergone a distortion compensation, and estimate a distortion amount from a reference base-band signal, a feedback base-band signal and frequency error information, and update a distortion compensation coefficient.

Yet still another aspect of the present invention is to remove propagation distortion component, generated on the way of the radio-wave propagation, such as fading distortion or multi-path distortion, thereby obtaining more stable compensation result. This removal can be achieved by the following method: estimate the propagation distortion from an input signal, and compensate the input signal for the propagation distortion. Then estimate an element distortion from a feedback signal formed by feeding back parts of an output signal and a signal compensated for its propagation distortion.

Another aspect of the present invention is to estimate a diffraction component of an input signal and an output signal, and estimate distortion of the elements from a feedback signal formed by feeding back parts of an output signal and a signal with its estimated diffraction component removed, thereby removing a diffraction component, i.e., an output signal leaking into an input section. This structure allows an output at the identical frequency to the input signal.

Another aspect of the present invention is to estimate propagation distortion from an input signal, remove both of a diffraction component and a propagation distortion component, thereby allowing stable distortion compensation at an identical frequency to the input signal.

Another aspect of the present invention is to obtain more highly accurate distortion compensation by the following method: estimate a frequency error between an input signal and a signal demodulated from the input signal, control a reference frequency both of the demodulation and element-distortion compensation, thereby synchronizing the reference frequency to a reference signal such as a symbol timing of the input signal, and update a distortion compensating coefficient.

Another aspect of the present invention is to realize power-saving distortion compensation by the following method: input a signal that is limited in its amplitude and calculate an element-distortion compensating coefficient to output an element-distortion compensated signal. Then feed back parts of the element-distortion compensated output signal and convert it to a feedback base-band signal. Limit an amplitude of the input signal and a reference base-band signal to obtain an amplitude-limited input signal and an amplitude-limited reference base-band signal. Estimate a distortion amount from the amplitude-limited reference base-band signal and the feedback base-band signal, thereby updating the element-distortion compensating coefficient.

Another aspect of the present invention is to separate an input signal into plural signals in response to the frequency as necessary, estimate an distortion amount of respective separated signals to compensate them for distortion, then combine them. This structure realizes more power-saving distortion compensation.

DETAILED DESCRIPTION OF THE EXEMPLARY EMBODIMENTS

Exemplary embodiments of the present invention are demonstrated hereinafter with reference to the accompanying drawings.

1. First Exemplary Embodiment

The present invention is applied to the digital TV broadcasting communication system. This case is demonstrated hereinafter with reference to accompanying drawings.

Figure 1:
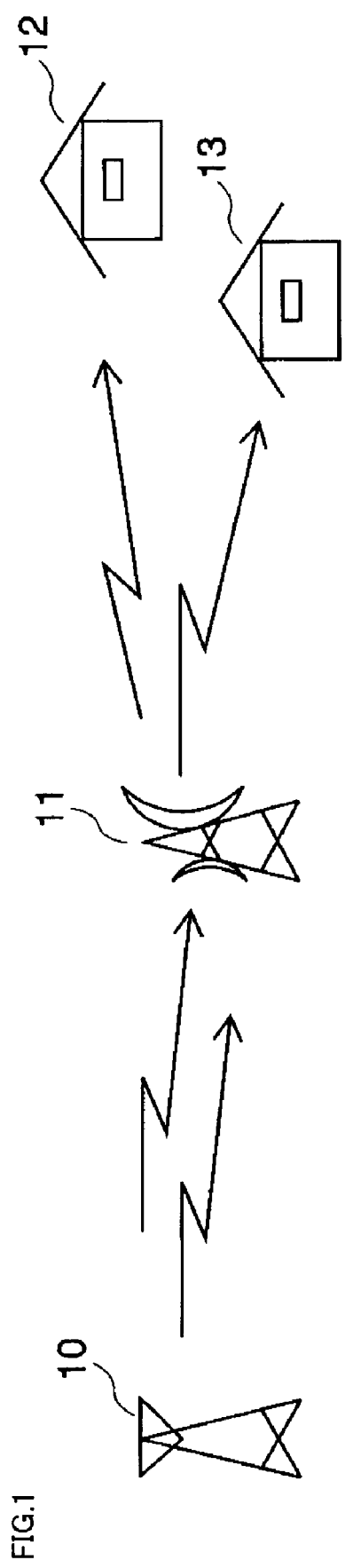
FIG. 1 is a schematic diagram illustrating a concept of digital TV broadcasting to which the present invention is applied.

A basic structure of the digital TV broadcasting communication system is shown in FIG. 1, where transmitter station 10 transmits a signal to receiver stations 12, 13 via relay station 11.

Figure 2:
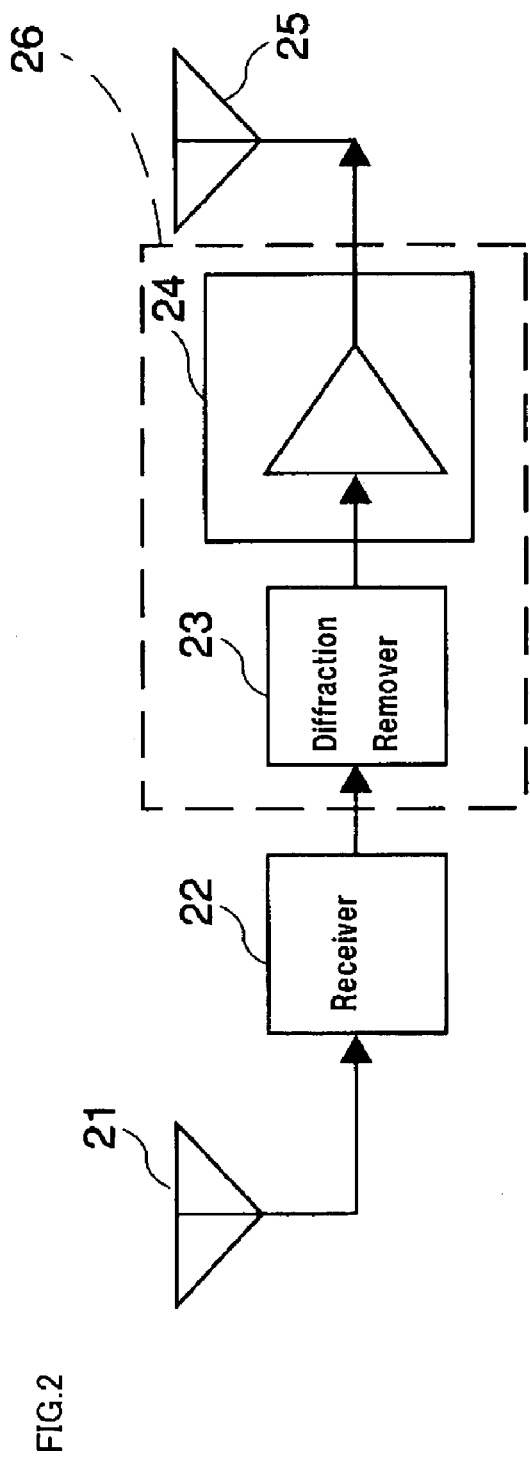
FIG. 2 is a block diagram illustrating a structure of a relay device shown in FIG. 1.

FIG. 2 shows a schematic structure of relay station 11 to which the present invention is applied. The broadcasting signal transmitted from broadcasting station 10 is received by receiver 22 through antenna 21 in relay station 11. Parts of the received signal is sometimes diffracted to receiving section 22 via a space and mixes with an input signal. This diffracted component is removed by diffraction remover 23, and then distortion compensator 24 compensates the signal for distortion of phase and amplitude. The signal is then amplified before it is output from antenna 25. Transmitter 26 of relay station 11 is formed of diffraction remover 23 and distortion compensator 24.

Compensator 24 has two independent processes. One is the process of compensation and amplification, which compensates the input signal for the distortion, amplifies the input signal and outputs it. The other one is the process of environmental adaptation, which estimates a distortion component from an input signal and an output signal, and minimizes the distortion component. Since those two processes are separated, accurate and stable operation of relay station 11 can be expected, and delay between a reception of an input signal and an output of the signal can be minimized.

Figure 3:
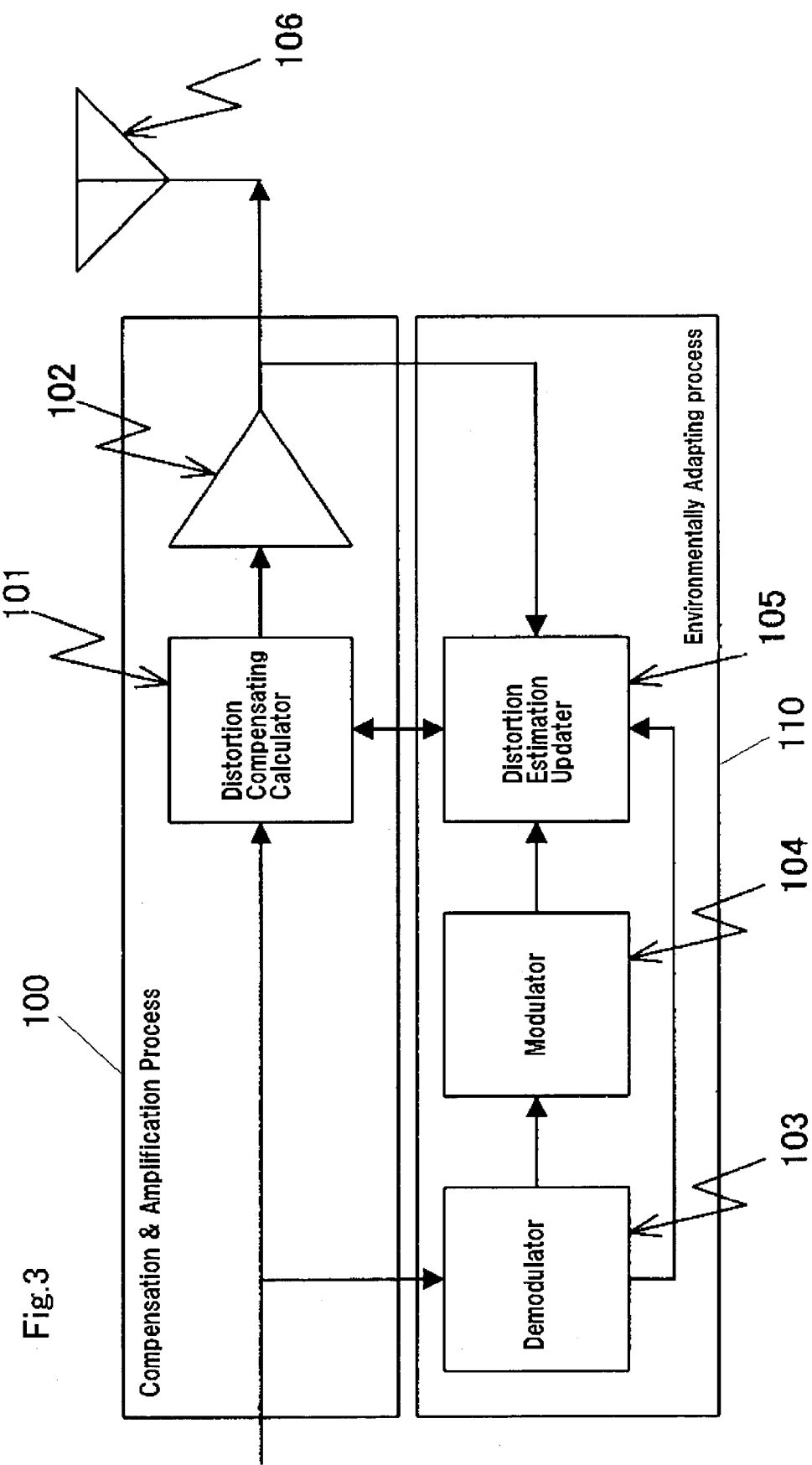
FIG. 3 is a block diagram showing a nonlinear distortion compensating device in accordance with a first exemplary embodiment of the present invention.

FIG. 3 is a block diagram showing a nonlinear distortion compensating device in accordance with the first exemplary embodiment of the present invention. The device shown in FIG. 3 expressly illustrates the structure of distortion compensator 24 where the process of compensation and amplification is separated from the process of environmental adaptation.

Compensation & Amplification processor 100 is formed of distortion compensating calculator 101 and amplifier 102. Calculator 101 receives an RF signal and a distortion compensating coefficient (described later) and outputs a distortion compensated signal that is compensated corresponding to a distortion component of amplifier 102 disposed in the next stage. Amplifier 102 receives the distortion compensated signal and amplifies the power of the signal before outputting it.

On the other hand, environmentally adapting processor 110 is formed of demodulator 103, modulator 104 and distortion estimating updater 105. Demodulator 103 receives the RF signal and outputs a demodulated signal. And modulator 104 modulates the demodulated signal again to a corresponding modulated signal. Updater 105 outputs the distortion compensating coefficient to calculator 101 and updates the coefficient. Antenna 106 radiates the output signal supplied from amplifier 102, and it corresponds to antenna 25 shown in FIG. 2.

Compensation & Amplification processor 100 receives the RF signal and supplies it to distortion compensating calculator 101, which stores a distortion compensating coefficient that compensates for a distortion component. Calculator 101 calculates a distortion compensated signal with the coefficient, RF signal and amplitude information detected from the RF signal, and outputs the distortion compensated signal to amplifier 102. Amplifier 102 amplifies the power of the signal up to a given level before outputting the signal. Most of the signals are radiated from antenna 106. The foregoing operation is expressed as the process of compensation & amplification in FIG. 3. The pre-distortion is carried out in this process.

The RF signal (input signal) received by compensation & amplification processor 100 and the output signal supplied from processor 100 are separated respectively. The separated RF signal is fed as a reference RF signal into environmentally adapting processor 110, and the separated output signal is also fed as a feedback signal into processor 110, of which operation is demonstrated below.

The reference RF signal is fed into demodulator 103, which demodulates the reference RF signal and outputs the demodulated signal. At the same time, the reference RF signal supplies timing-synchronizing information such as symbol synchronizing information and burst-synchronizing information to distortion estimating updater 105. The demodulated signal is then fed into modulator 104, which modulates again the reference RF signal following a modulating method applied to the RF signal. The reference signal is fed into distortion estimating updater 105.

On the other hand, the feedback signal separated from the output signal is fed into distortion estimating updater 105, which updates the contents of distortion compensating calculator 101 based on the timing-synchronizing information obtained from demodulator 103 at the timing when the distortion compensation is least affected. For this updating, updater 105 uses the amplitude information and the compensating coefficient both detected by calculator 101 for finding an error between a distortion component produced by amplifier 102 and a distortion compensating coefficient supplied from a memory (memory 508 is described later and shown in FIG. 5). An environmentally adapting process is thus carried out, so that a distortion produced by amplifier 102 can be compensated even if the contents of the distortion compensating coefficient does not agree with the distortion characteristics of amplifier 102.

The structure shown in FIG. 3 illustrates that a feedback signal separated from parts of an output signal is fed into distortion estimating updater 105. Here is a method for carrying out the distortion compensation by converting the feedback signal into an IF frequency lower than a carrier frequency. This method is demonstrated below with reference to FIG. 4.

Figure 4:
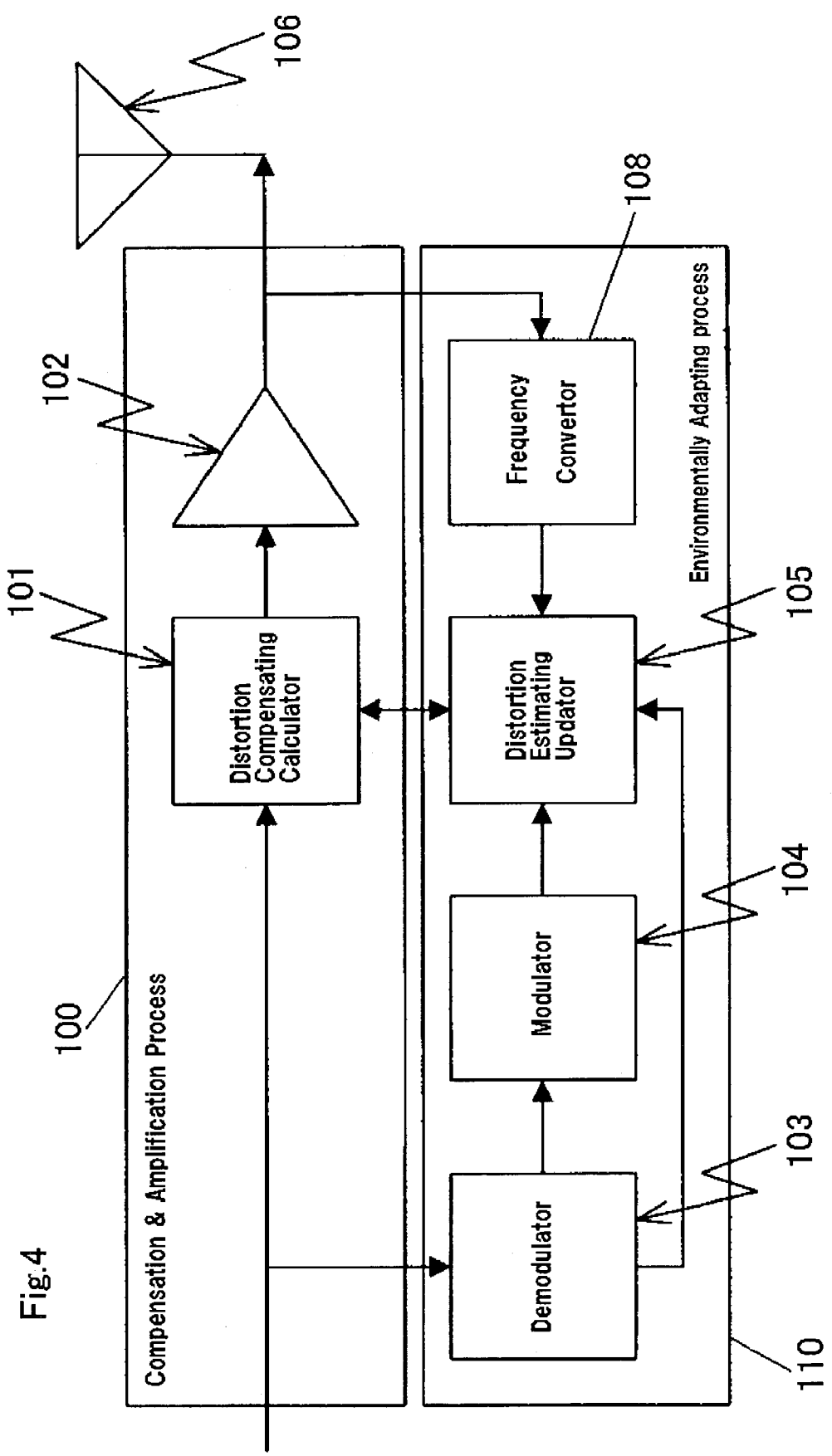
FIG. 4 is a block diagram showing another nonlinear distortion compensating device in accordance with the first exemplary embodiment of the present invention.

In FIG. 4, similar elements to those in FIG. 3 have the same reference marks. Frequency converter 108 converts the feedback signal separated from the output signal that is tapped off from compensation & amplification processor 100, and outputs a feedback signal in IF band. A similar process of compensation & amplification to that shown in FIG. 3 is carried out, and in the process of environmental adaptation, the feedback signal is converted its frequency into an IF frequency lower than the carrier signal before being fed into distortion estimating updater 105. On the other hand, modulator 104 modulates the signal supplied from demodulator 103 at the same frequency as the IF band feedback signal converted by frequency converter 108.

This structure allows distortion estimating updater 105 to process signals of a wider range frequencies and use a frequency different from the carrier frequency. Thus the structure can simply prevent the diffraction of an output signal. A frequency to be estimated is thus can be lowered, so that its wave-length becomes longer, which relatively increases the accuracy of the elements. As a result, an accuracy to be used for delay control can be relatively increased. Therefore, a more accurate system can be achieved.

When the distortion characteristics are typically stable and the contents of the distortion compensating coefficient are assumed to substantially agree with the distortion characteristics, the environmental adaptive process is not needed.

Figure 5:
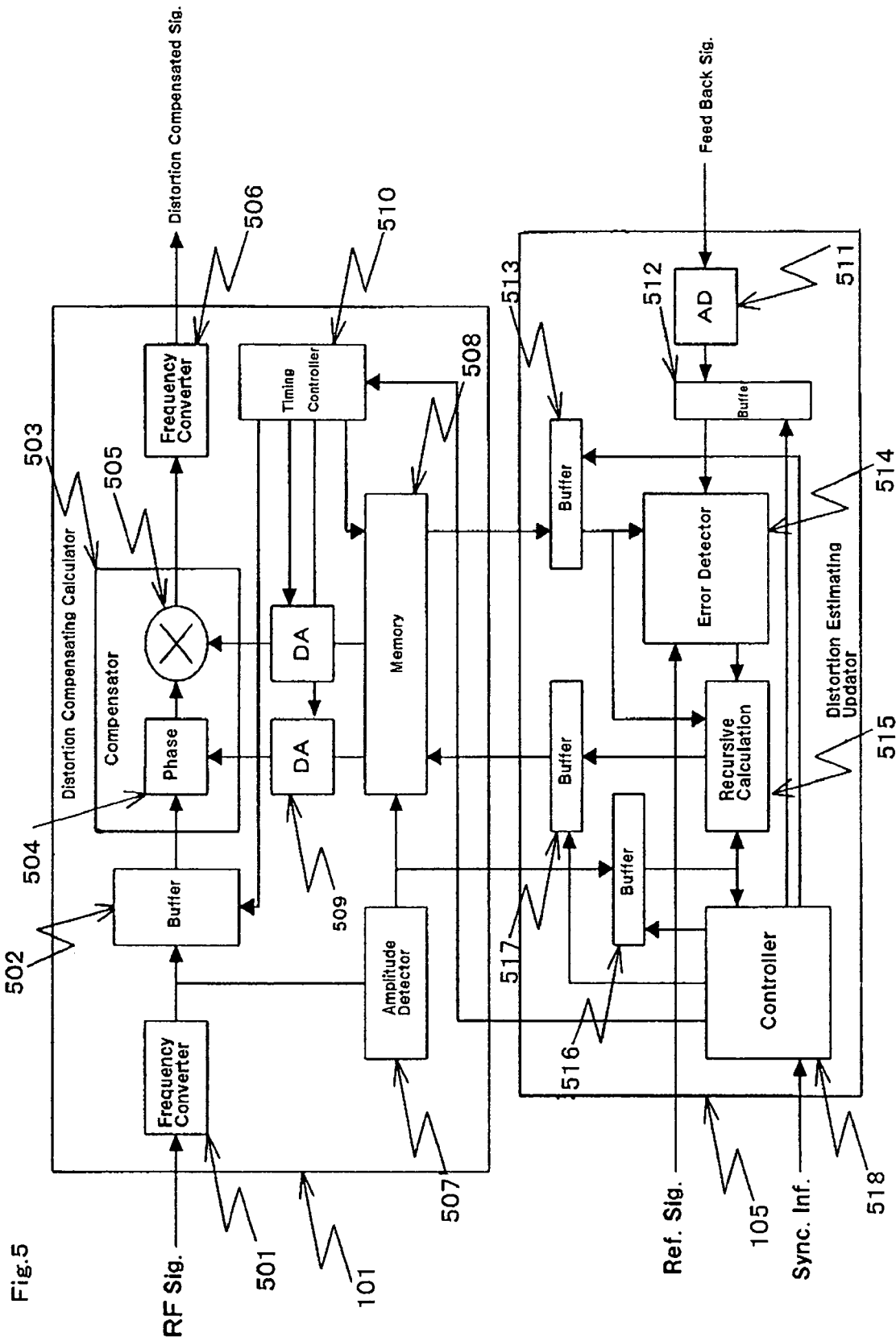
FIG. 5 is a block diagram illustrating a distortion compensating calculator and an estimation updating section shown in FIG. 3 and FIG. 4.

Next, distortion compensating calculator 101 and distortion estimating updater 105 shown in FIG. 3 and FIG. 4 are detailed with reference to FIG. 5. Distortion compensating calculator 101 comprises the following elements:

(a) frequency converter 501 for converting an RF signal into an IF signal;

(b) buffer 502 for holding the IF signal temporarily and outputs the signal to compensator 503;

(c) another frequency converter 506 for converting an IF signal with its distortion compensated into an RF signal again;

(d) amplitude detector 507 for detecting a signal amplitude of the IF signal;

(e) memory 508 for storing compensating coefficients for distortion compensation, and outputting a compensating coefficient in response to a signal supplied from amplitude detector 507;

(f) DA converter 509 for converting the compensating coefficient supplied from memory 508 into an analog data; and (g) timing controller 510 for controlling the timings of operations carried out by respective elements in calculator 101.

Compensator 503 is formed of phase-compensator 504 and gain-compensator 505.

Distortion estimating updater 105 comprises the following elements:

(h) AD converter 511 for converting a feedback signal into a digital data;

(i) buffer 512 for holding the digitized feedback signal temporarily and outputs the digital data as a feedback signal to error detector 514;

(j) another buffer 513 for holding temporarily the compensating coefficient supplied from memory 508 and outputting the data as a compensating coefficient output signal;

(k) error detector 514 for detecting an error component produced by a distortion or a system error from the buffered feedback signal supplied from buffer 512, the compensating coefficient from buffer 513 and the reference signal;

(l) recursive calculator 515 for producing an updated compensating coefficient through a recursive calculation on a distortion component from the error component detected;

(m) still another buffer 516 for holding amplitude information temporarily and outputting the data as an amplitude information signal;

(n) buffer 517 for holding temporarily the updated distortion compensating coefficient and outputting the data as a coefficient signal; and (o) controller 518 for controlling the timings of distortion estimating updater 515.

Frequency converter 501 receives an RF signal and converts the signal into an IF signal of which frequency is lower than the carrier frequency. The IF signal is fed into amplitude detector 507 and buffer 502. Amplitude detector 507 detects the amplitude of the IF signal and outputs the amplitude information. Memory 508 includes a two-pageful area for storing information. Both the pages store phase-compensating coefficients and gain-compensating coefficients. Memory 508 uses the amplitude information supplied from detector 507 and outputs compensating coefficients, corresponding to the amplitude information, for phase and gain. Those coefficients are fed into DA converter 509.

Timing controller 510 controls the timings of the buffer output signal supplied from buffer 502 and the signal converted to analog by DA converter 509. The buffer output signal delays by the time corresponding to a sequence of time until a compensating coefficient is supplied from an IF signal. On the other hand, the analog converted signal adjusts timing by an amount corresponding to a delay produced in phase compensator 504 and gain compensator 505.

DA converter 509 follows the control signal supplied from timing controller 510 and converts a compensating coefficient supplied from memory 508 into an analog compensating signal. Buffer 502 follows a control signal from timing controller 510 and outputs an IF signal as a delayed IF signal, which is then fed into compensator 503 formed of phase-compensator 504 and gain-compensator 505. Compensator 503 compensates the phase and gain of the IF signal with an analog compensating signal supplied from DA converter 509, and outputs a distortion compensated IF signal. This distortion compensated IF signal is fed into frequency converter 506, which then outputs again the distortion compensated signal, namely, the carrier frequency. The distortion compensated signal passes through the amplifier and parts of the signal are fed as a feedback signal into distortion estimating updater 105.

AD converter 511 converts a feedback signal into a digital signal and outputs a digital feedback signal, which is temporarily held by buffer 512, which then outputs a delayed feedback signal following a control signal supplied from controller 518. In a similar way, the distortion compensating coefficient referred to by memory 508 is temporarily held by buffer 513, which then outputs a delayed compensating coefficient signal following a control signal supplied from controller 518. Error detector 514 detects an error component to be used for updating the compensating coefficient from the delayed feedback signal supplied from buffer 512, the delayed compensating coefficient signal supplied from buffer 513, the reference signal formed by demodulating, and re-modulating the RF signal.

The amplitude information detected from the IF signal is temporarily held by buffer 516, which then outputs a delayed amplitude information signal following a control signal supplied from controller 518. Recursive calculator 515 carries out a calculation which finds quickly and accurately a compensating coefficient corresponding to the distortion characteristics of the amplifier from the amplitude information signal, delayed compensating coefficient signal and an error signal. In general, LMS (Last Mean Square) algorithm or RLS (Recursive Least mean Square) algorithm are known as this calculation.

The updated compensating coefficient is held temporarily by buffer 517 and then outputs a compensating coefficient updating signal following a control signal supplied from controller 518, then updates a compensating coefficient in one page-full area of memory 508 with the updating signal. Controller 518 determines the timing at which the coefficient is updated based on the synchronizing information supplied from the demodulator plus other information such as an amplitude information signal, a modulating rate, the distortion characteristics of the amplifier, and influence due to environmental changes. For instance, in the case of a drastic environmental change, intervals between the updates are shortened, and in the case of stable environment, the intervals are prolonged. Further, just before the updating, all the compensating coefficients are smoothed, thereby removing unnecessary components, so that errors produced by delay amounts or quantization can be reduced in the coefficients.

When the update of the compensating coefficient is over, an update-over signal and synchronizing information are supplied to timing controller 510. After receiving the update-over signal, controller 510 outputs a page-turn signal to memory 508, thereby controlling the update to be reflected to compensating coefficients. When controller 510 outputs the page-turn signal, the output timing should be at a changeover of the symbols obtained from the synchronizing information or a gap of the burst, where a sharp change of a compensating coefficient would not adversely influence the system.

Controller 518 controls an output signal from buffer 512 such that a time difference between a delayed feedback signal and a reference signal can be adjusted. Controller 518 also controls an output signal supplied from buffer 513 such that a time difference between a delayed distortion compensating coefficient signal and the reference signal. Controller 518 controls an output signal from buffer 513 to adjust a time difference between a delayed amplitude information signal and the reference signal.

As discussed above, a complete separation of the compensation & amplification process and the environmentally adapting process from each other allows updating a compensation coefficient free from bothering the distortion compensation. Further, a direct compensation of an RF signal for distortion allows minimizing a delay amount produced in the distortion compensation, so that the foregoing structure can be applied to relay devices, although the pre-distortion technique has been not suited to the relay devices.

In the foregoing description, the distortion compensation is provided to the IF signal converted to a frequency lower than the carrier frequency; however it can be provided to the carrier frequency as it is. In this case, at least one of frequency converters 501 and 506 becomes not needed, so that the number of steps of the distortion compensation is reduced, which decreases the delay amount. In the case of different carrier frequencies in an input signal and an output signal, one of converts 501 or 506 is not needed. In the case of an identical carrier frequency in the input signal and the output signal, both of converts 501 and 506 are not needed.

A signal in IF band is distortion-compensated, so that the signal has a longer wave-length than the RF signal. As a result, a relatively finer delay-control or calculation can be done. In other words, the compensation to an IF signal can be more accurate. A delay amount in buffer 502 is determined uniquely depending on a center frequency of an IF signal, an operation clock of the system, amplitude detector 507 and memory 508, so that a delay line having a given delay amount can be used.

Frequency converter 501 converts a signal in a given RF band to that in an IF band, and converter 506 converts the signal in the IF band to that in the given RF band. In the case of an input signal and an output signal having an identical frequency, there is no difference in the frequencies, so that an identical frequency source can be used. A use of an identical frequency source for converters 501 and 506 can eliminate a frequency error produced between the input and the output.

Figure 6:
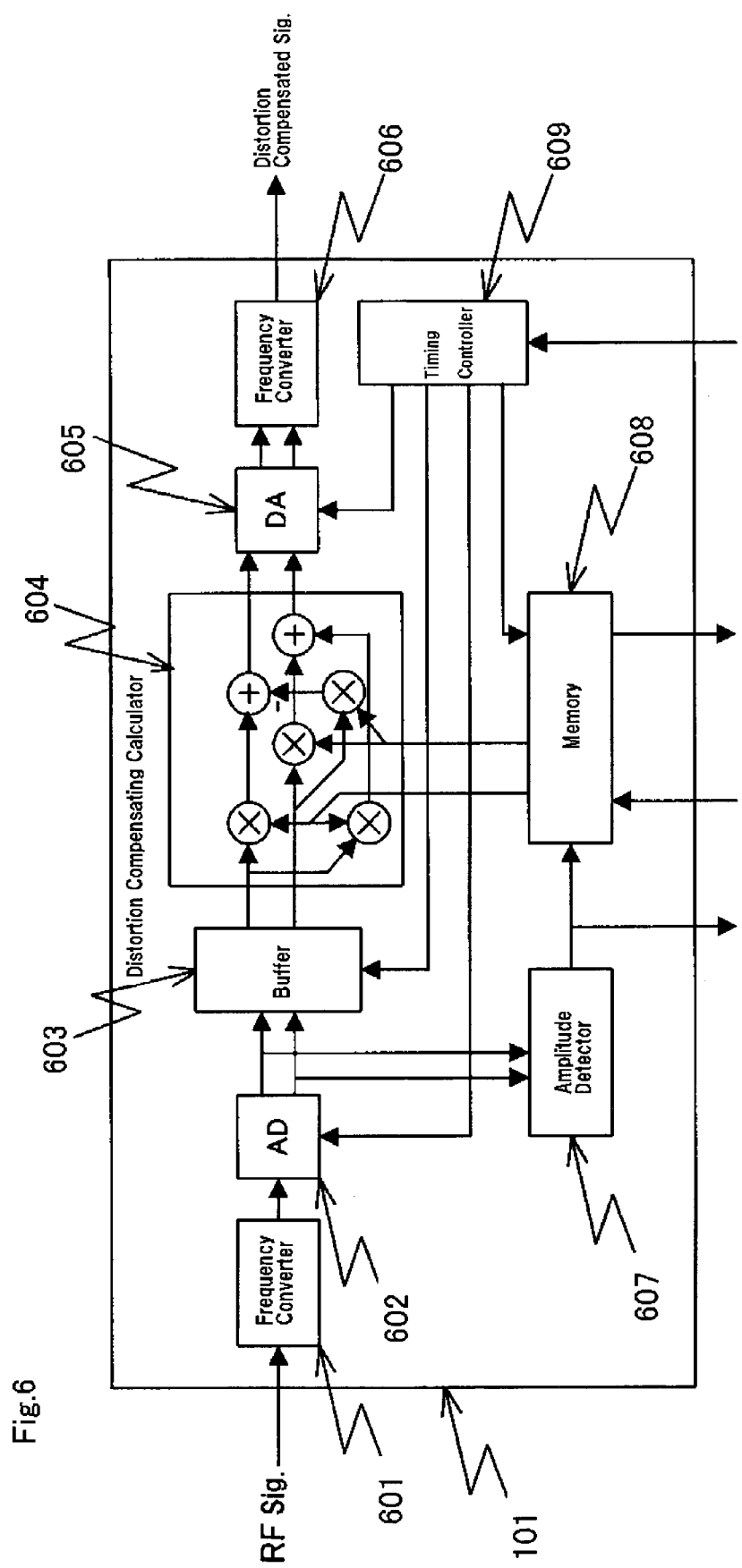
FIG. 6 is a block diagram illustrating another distortion compensating calculator of FIG. 5.

In this embodiment, compensator 503 is formed of phase-compensator 504 and gain-compensator 505, however, calculations using complex information can adjust simultaneously the phase and the gain. This adjustment allows phase-compensator 504 and gain-compensator 505 having different delay amounts to have the same delay amount. Thus a delay amount can be adjusted and controlled with ease. In the case of the calculation using complex information, the information stored in memory 508 is not classified into the phase and the gain because the compensating coefficients are formed of the complex information. FIG. 6 shows the distortion compensating calculator thus structured. Compensator 604 is structured to produce a complex product and digital processing. This structure allows buffer 603 used for adjusting a delay time to be formed of digital elements, so that the device can be highly accurate and built with ease. Other sections, structures and operations remain generally unchanged as those shown in FIG. 5.

The foregoing description refers to two-pageful memory 508; however, memory 508 is not necessarily two-pageful, and it can be one-pageful and unused compensating coefficients can be updated one by one. This structure can thus reduce a memory capacity.

Figure 7:
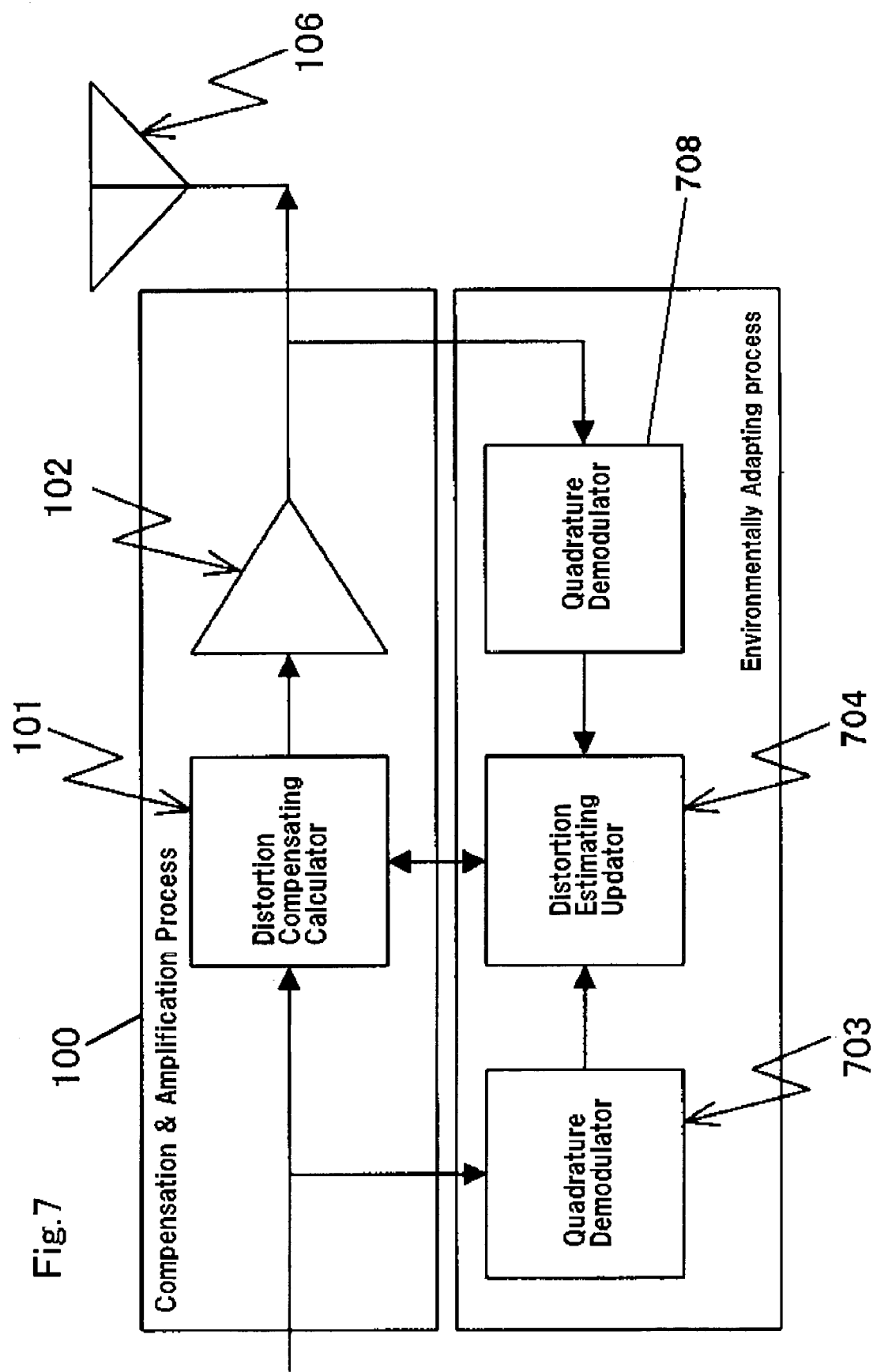
FIG. 7 is a block diagram illustrating still another nonlinear distortion compensating device in accordance with the first exemplary embodiment of the present invention.

In this embodiment, the environmental adaptation process is carried out at a frequency in RF band or IF band; however, the distortion can be estimated with a base-band signal. A structure in this case is shown in FIG. 7, where similar elements to those in FIG. 4 have the same reference marks, and only the differences from those in FIG. 4 are described hereinafter. Demodulator 103 and frequency converter 108 in FIG. 4 are replaced with quadrature demodulators 703 and 708 respectively, and modulator 104 in FIG. 4 is eliminated in FIG. 7. Quadrature demodulator 703 converts an RF signal into a base-band signal, and quadrature demodulator 708 converts a feedback signal into a base-band signal.

A distortion of a base-band signal converted is estimated by distortion estimating updater 704, so that a phase difference or an amplitude difference between a reference signal and a feedback signal can be calculated with ease. Further, since the frequency of the signals are low enough, a sophisticated calculation can be done, and less power consumption can be also expected.

2. Second Exemplary Embodiment

In addition to the contents described in the first embodiment, an input signal is undergone demodulation and detection, and the signal re-modulated is used as a reference signal in this second embodiment. Only the differences from the first embodiment are described hereinafter with reference to FIG. 3.

Demodulator 103 demodulates, detects and then converts an input signal into digital data. Parts of the results of the demodulation and detection are supplied to distortion estimating updater 105. Modulator 104 re-modulates the signal based on the digital data converted as well as following the same modulating method and the same frequency as those of the input signal, and outputs the reference signal. Distortion estimating updater 105 calculates a distortion component produced by amplifier 102 based on the results of the demodulation and detection, the reference signal, and a feedback signal from amplifier 102, and outputs a distortion compensating coefficient that can remove the distortion component.

As described above, a reference signal is once demodulated and detected, then re-modulated. This process not only increases the accuracy of symbol synchronizing information and burst synchronizing information, but also allows the input RF signal to produce the reference signal free from adverse influence from the changes of distortion or gain caused by the propagation path and the input elements. As a result, stable distortion compensation can be expected.

In a poor receiving environment, a signal with small receiving power and fading causes to produce an error in the demodulation and detection. In the case of an error, it is not proper to carry out the distortion compensation based on the reference signal re-modulated from the digital data that includes the error. To avoid such a case, normal detection information is fed into distortion estimating updater 105 to determine whether or not the result of the demodulation and detection is correct. Updater 105 carries out or halts the distortion estimation depending on the normal detection information. As a result, reliability and stableness are obtainable even if an error produced by the demodulation and detection exists. This normal detection information can be formed of an error checking mechanism known as cyclic redundancy check code (CRC) specified in the formats of digital data, or a value of receiving power.

Demodulator 103 can provide an input signal with timing synchronization for adjustment in addition to the demodulation and detection. Demodulator 103 carries out the timing synchronization and supplies the timing-synchronizing information to distortion estimating updater 105, so that updater 105 can switch over various timings to be in synchronization with the input signal. This mechanics can minimize distortions and noises produced by the switching such as a switch timing of re-writing the distortion compensating coefficients, a switch timing of turning a page in the memory that stores the compensating coefficients.

Figure 8:
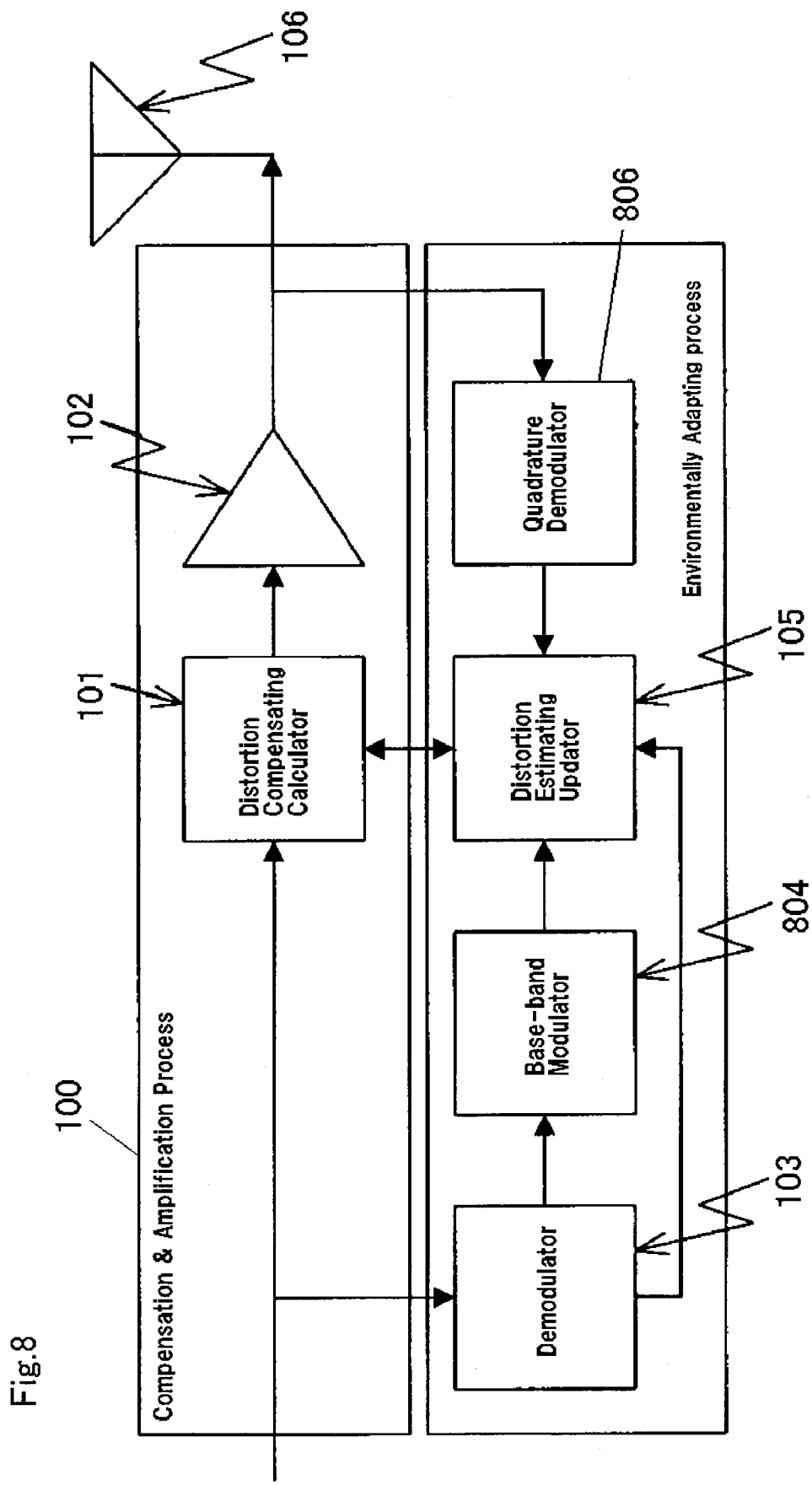
FIG. 8 is a block diagram showing a nonlinear distortion compensating device in accordance with a second exemplary embodiment of the present invention.

The foregoing processes can be carried out after the signal is converted into the base-band or IF band, as discussed in the first embodiment. A structure in such a case is shown in FIG. 8. Only differences from the structure shown in FIG. 3 are described hereinafter. Modulator 104 in FIG. 3 is replaced with base-band modulator 804 which re-modulates the signal based on the digital data and outputs a reference base-band signal, and quadrature demodulator 806 is additionally prepared in this second embodiment. Quadrature demodulator 806 converts a feedback signal into a feedback base-band signal. This structure allows distortion estimating updater 105 to process the signal having a lower frequency, so that the process becomes more sophisticated and accurate.

Figure 9:
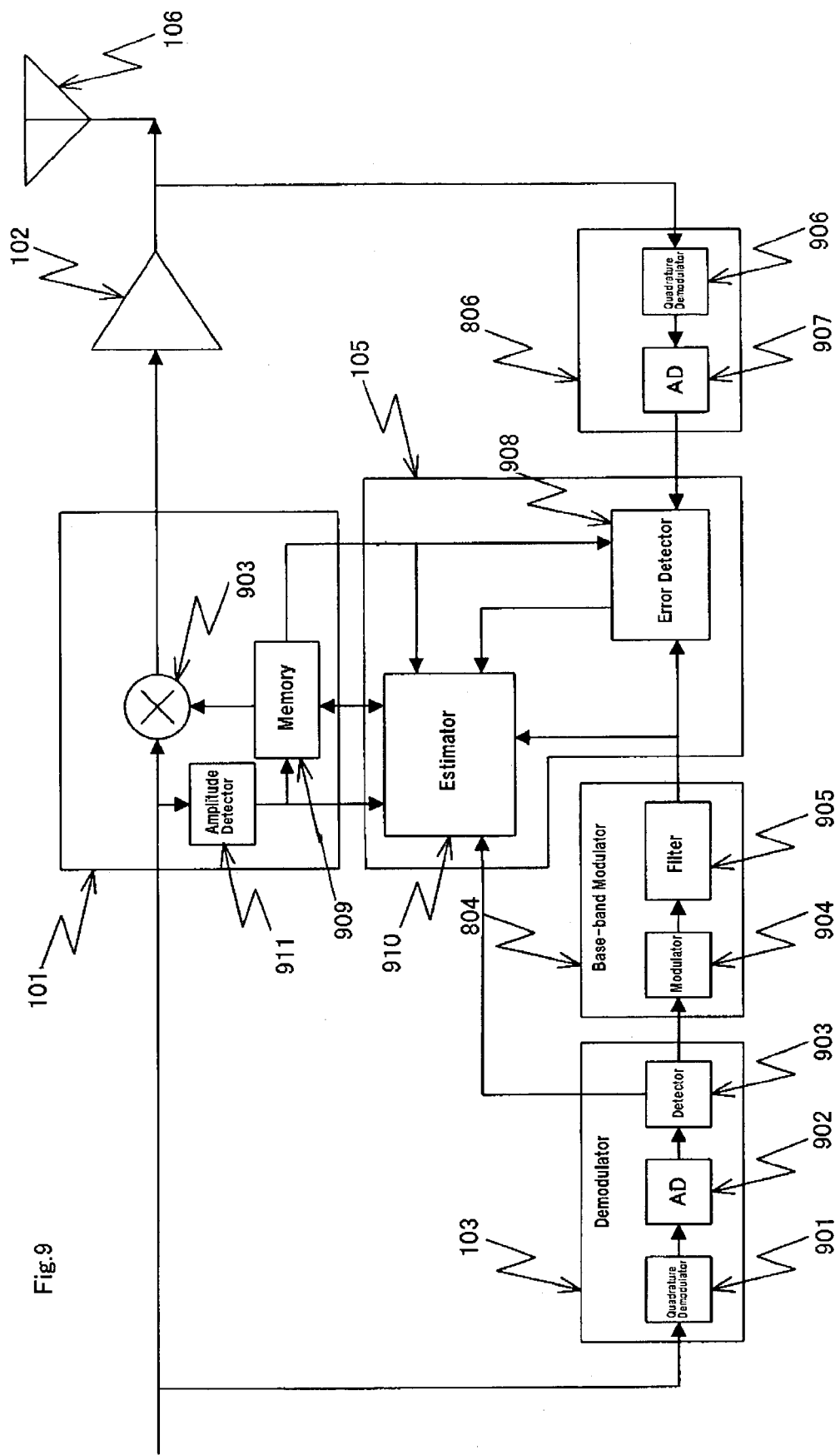
FIG. 9 is a block diagram showing another nonlinear distortion compensating device in accordance with the second exemplary embodiment of the present invention.

The environmental adaptation process in base-band has been described with reference to FIG. 8. In the case of the process in IF band instead of the base-band, the reference base-band signal and the feedback base-band signal supplied respectively from base-band modulator 804 and quadrature demodulator 806 are replaced with a reference IF signal and a feedback IF signal. This structure is detailed with reference to FIG. 9. Amplifier 102, antenna 106, distortion compensating calculator 101, demodulator 103, base-band modulator 804, distortion estimating updater 105, and quadrature demodulator 806 in FIG. 9 correspond to the respective ones in FIG. 8. The distortion compensating calculation by calculator 101 and an estimation and updating of a distortion compensating coefficient by updater 105 remain unchanged as those in FIG. 8, the descriptions thereof are thus omitted, and only the differences are described hereinafter.

Demodulator 103 is formed of quadrature demodulator 901, AD converter 902, and detector 903. Demodulator 901 provides an input signal with quadrature demodulation, and outputs a base-band signal. Converter 902 converts the base-band signal into a digital form and outputs the digital base-band signal. Detector 903 detects the digital base-band signal, and outputs a data stream.

Base-band modulator 804 is formed of modulator 904 and filter 905. Modulator 904 receives the data stream, modulates the data stream following the same modulation method as that of the input signal, and outputs the modulated signal. Filter 905 limits the bandwidth of the modulated signal and shapes its waveform.

Quadrature demodulator 806 is formed of quadrature demodulating section 906 and AD converter 907. Demodulating section 906 provides a feedback signal with quadrature demodulation, and outputs a base-band signal. AD converter 907 converts the base-band signal into a digital form, and outputs digitized feedback base-band signal.

An input signal passes through quadrature demodulator 901 and AD converter 902, where the input signal is quadrature-demodulated and quantized before being output as a digital base-band signal. Then detector 903 provides the signal with timing synchronization, frequency synchronization, and adjustments of phase and gain following a format of the modulating method, and determines the demodulated signal formed of symbols and data-rows of signal based on the status of phase and amplitude of the digital base-band signal. Then detector 903 also provides the signal with error-detection and correction typically including block codes known as CRC, BCH, or convolution codes, and outputs a data stream as well as detection information. The detection information includes timing synchronization information, frequency information, gain information, and correction information as well as error information produced in detecting errors and correcting.

Detecting process by detector 903 depends on a modulating method or a data format; however, in the case of single carrier modulation, an equalizing process can be used. In the case of OFDM, Fourier transform can be used. In the case of CDMA, a convolution calculation can be used.

The data stream supplied from detector 903 is re-coded by modulator 904 following a given format, and is output as a modulated signal. Then filter 905 shapes the waveform and then outputs the reference signal.

On the other hand, the feedback signal is quadrature-demodulated by quadrature demodulating section 906, and digitized by AD converter 907, then supplied to error detector 908 as digitized feedback base-band signal.

Error detector 908 extracts error information from the reference signal, feedback base-band signal, and the compensating coefficient supplied from memory 909, and outputs the error information to estimator 910, which estimates a new compensating coefficient and outputs it to memory 909 for updating. The new coefficient is estimated, based on the error information, compensating coefficients and the information about amplitude and detection supplied from amplitude detector 911, such that the new coefficient can minimize the error. When the coefficient is estimated and updated, estimator 910 refers to detection information such as timing synchronizing information, frequency information, and gain information; however, if they represent a condition not better than a predetermined condition, the estimation or updating is halted temporarily until the condition becomes better. If influence of multi-path or fading is expected, further use of the information about error-correction, detection of multi-path and fading (e.g. delay dispersion, fluctuation of frequency or phase) achieves more stable operation.

In the case of the nonlinear distortion compensating device of the present invention, an input signal undergoes distortion compensation using the process of compensation and amplification and is supplied as an output signal. Therefore, rewriting the compensation coefficient directly influences the output signal or switching the table that stores the coefficient disturbs the waveform of the output signal. In order to reduce or remove such adverse influence, estimator 910 rewrites the coefficient or switches the table at the timing that minimizes the influence to the input signal based on the timing synchronizing information included in the detection information. As a result, a stable and highly accurate output waveform is obtainable.

Figure 10:
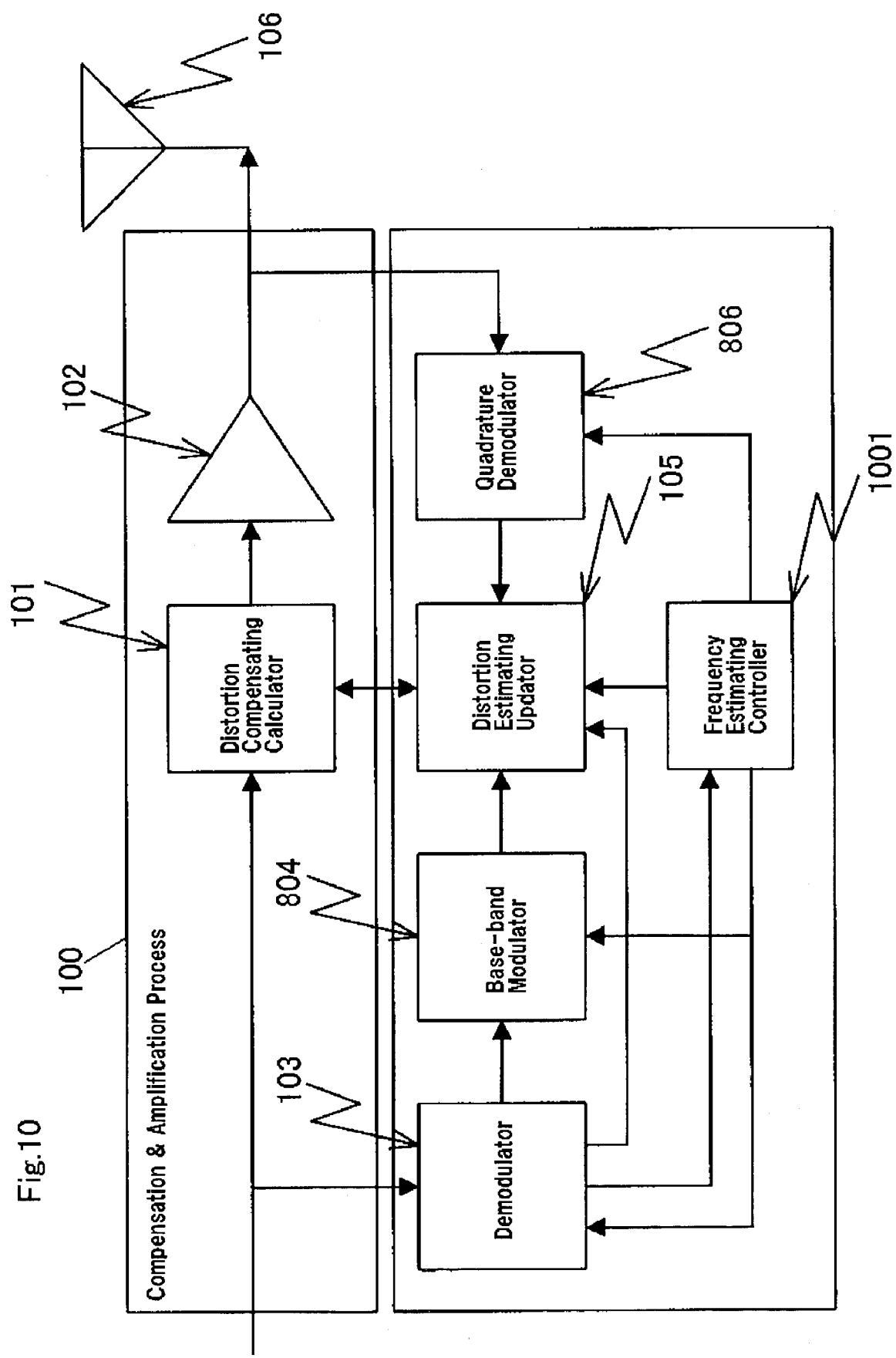
FIG. 10 is a block diagram showing still another nonlinear distortion compensating device in accordance with the second exemplary embodiment of the present invention.

If there is an error between the frequency of the input RF signal and the frequency supplied from the frequency source used for conversion in demodulator 103 as well as in quadrature demodulator 806 shown in FIG. 8, a countermeasure should be taken. This countermeasure is described hereinafter with reference to FIG. 10, in which similar elements to those in FIG. 8 have the same reference marks. In the structure shown in FIG. 10, frequency estimating controller 1001 is additionally disposed to the structure shown in FIG. 8. Controller 1001 receives frequency-error information obtained in the demodulation and detection, and outputs frequency control information based on the frequency error information to demodulator 103, base-band modulator 804, distortion estimating updater 105, and quadrature demodulator 806.

Demodulator 103 provides a signal with demodulation and detection before outputting digital data, and at the same time, it detects a frequency error component from the decoded signal and outputs the error component as frequency-error information to frequency error estimating controller 1001. Based on this error information, controller 1001 adjusts respective frequency sources of demodulator 103, base-band modulator 804, and quadrature demodulator 806. At the same timing controller 1001 transmits the frequency-error information to distortion estimating updater 105, which estimates distortions from the reference base-band signal and the feedback base-band signal. On the other hand, updater 105 adjusts frequencies of the reference base-band signal and the feedback base-band signal based on the frequency-error information, and cancels the frequency error. When the frequency error becomes greater than a given value, updater 105 halts the estimation of distortions on the assumption that it detects an abnormality.

The foregoing operation allows correcting the frequency based on the input signal even if the reference frequency generated by the device has an error. In this second embodiment, even if the reference signal has an error, the process of amplification & compensation does not convert the frequency (even if it converted the frequency, the identical frequency-source would be used for conversion as described above.) Thus the output waveform is not influenced. As a result, a deviation of the reference frequency does not need a halt of the process of amplification & compensation, and a stable operation is obtainable. On the other hand, in the environmentally adapting process, a frequency error halts the operation of distortion estimating updater 105 or prompts controller 1001 to control the frequency correction at the respective elements, so that a highly stable and reliable operation is achievable.

3. Third Exemplary Embodiment

Another distortion compensator is prepared before the distortion compensating calculator described in the first embodiment, so that a more accurate distortion compensating device is obtainable. This is described in this third embodiment.

Figure 11:
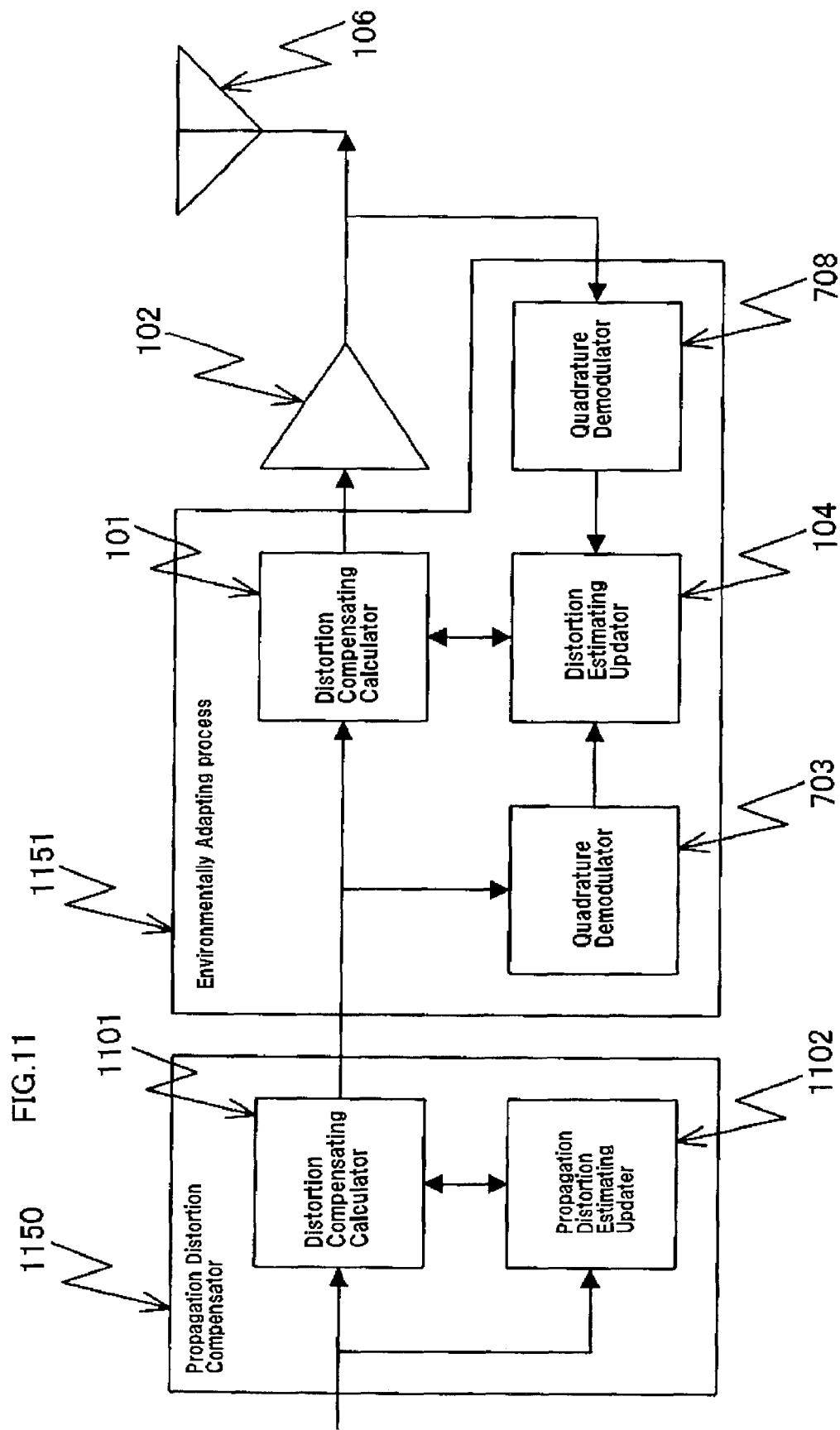
FIG. 11 is a block diagram showing a nonlinear distortion compensating device in accordance with a third exemplary embodiment of the present invention.

A nonlinear distortion compensating device shown in FIG. 11 comprises the following elements:

propagation-distortion compensator 1150 for receiving an input signal, and outputting a propagation distortion compensating signal that compensates for a distortion produced in the propagation path;

element-distortion compensator 1151 for receiving the propagation distortion compensating signal, and outputting an element distortion compensating signal that estimates and cancels a distortion component of amplifier 102;

amplifier 102 for receiving the element distortion compensating signal, and outputting an amplified signal; and antenna 106 for radiating the output signal.

Element-distortion compensator 1151, amplifier 102, and antenna 106 in FIG. 11 are similar to those of the nonlinear distortion compensating device shown in FIG. 7, and only the differences from FIG. 7 are described hereinafter. Propagation-distortion compensator 1150 is formed of the following elements:

propagation-distortion estimating updater 1102 for estimating a propagation-distortion component from the input signal, and outputting a propagation-distortion compensating coefficient that cancels the estimated distortion component; and distortion compensating calculator 1101 for receiving the input signal, and outputting a propagation-distortion compensating signal by using the input signal and the propagation-distortion compensating coefficient supplied from updater 1102.

Propagation distortion estimating updater 1102 estimates a propagation-distortion from the input signal, and outputs the propagation-distortion compensating coefficient to distortion compensating calculator 1101. Calculator 1101 uses the coefficient and the input signal, thereby carrying out a calculation for removing a propagation-distortion component existing in the input signal, and outputs a propagation-distortion removed signal. This signal is fed into element-distortion compensator 1151 disposed after compensator 1150. Element-distortion compensator 1151 provides the signal with the foregoing signal processing, and outputs the element-distortion compensated signal, which is then amplified by amplifier 102 and output from antenna 106.

Updater 1102 outputs propagation-distortion compensating coefficients, an initial value of one of coefficients is set at 1.0 and others are at 0.0, and assigns the coefficients to distortion compensating calculator 1101. Then updater 1102 estimates a propagation-distortion removing coefficient from the input signal. To be more specific, the coefficient can be estimated from a correlation signal or a phase difference between the input signal and a known signal included in the input signal. This is because a multi-path component can be found from a correlation signal of an input signal, or fading-distortion can be found from a pilot signal or a sync signal included in the input signal. The coefficient thus obtained is fed into distortion compensating calculator 1101 and updated. Calculator 1101 is formed of FIR (finite impulse response) filter that carries out a convolution calculation of this coefficient and the input signal. At the foregoing initial status, this calculation delays the input signal by a given time and outputs the signal as it is. A setting of the propagation-distortion compensating coefficient will remove a component corresponding to multi-path distortion or fading distortion, and the propagation-distortion compensated signal is output.

The foregoing structure allows an input signal, which includes multi-path distortion or fading distortion, to be supplied to antenna 106 as a higher quality signal free from those distortions. Because propagation distortion compensator 1150 estimates and compensates for those distortions. A poor receiving condition does not adversely so much affect this structure. Propagation distortion compensator 1150 and element distortion compensator 1151 are disposed independently in the device, so that the function of propagation distortion compensator can be added depending on an operational environment.

In a conventional relay device, an input signal and an output signal are often set at different frequencies. In the case of using an identical frequency, parts of an output signal radiated from an antenna are sometimes diffracted into and mixed with the input signal the air. A nonlinear distortion compensating device equipped with a diffraction remover that removes the foregoing diffraction component is demonstrated hereinafter with reference to FIG. 12.

Figure 12:
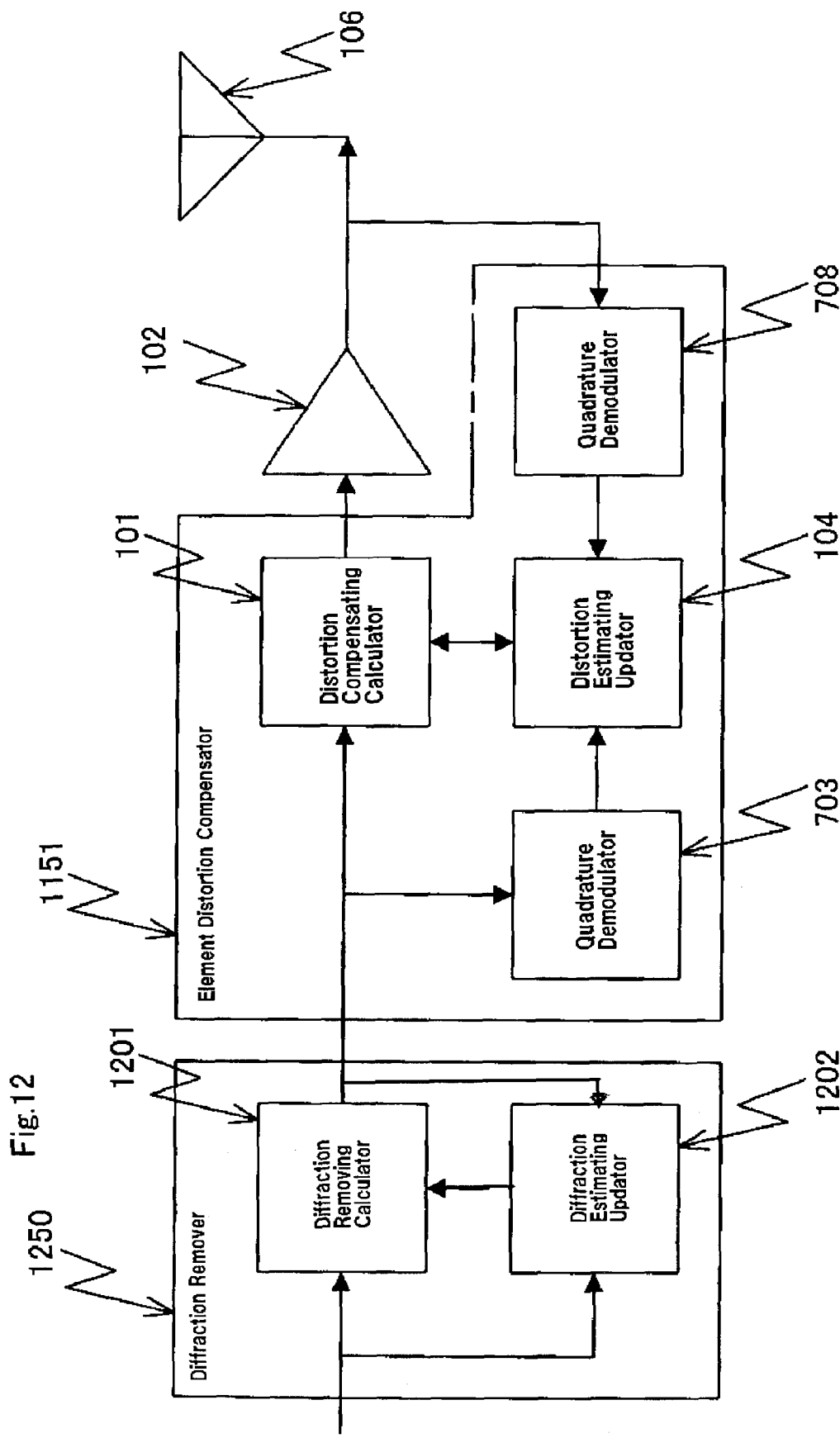
FIG. 12 is a block diagram showing another nonlinear distortion compensating device in accordance with the third exemplary embodiment of the present invention.

The nonlinear distortion compensating device shown in FIG. 12 includes diffraction remover 1250 which supersedes propagation distortion compensator 1150 disposed in the structure shown in FIG. 11. Other elements and their operations remain unchanged as those shown in FIG. 11, and the unchanged elements have the same references marks and the descriptions thereof are omitted here.

Diffraction remover 1250 comprises the following elements:

diffraction removing calculator 1201 for removing a diffraction component from the input signal with a diffraction removing coefficient, and outputting a diffraction removed signal; and diffraction estimating updater 1202 for estimating a diffraction component of the input signal from the diffraction removed signal, and outputting a diffraction removing coefficient that removes the diffraction component from the input signal.

Diffraction estimating updater 1202 outputs tap coefficients, an initial value of one of the coefficients is set at 1.0 and others are set at 0.0, and the coefficients are assigned to diffraction removing calculator 1201. Calculator 1201 is formed of FIR (finite impulse response) filter that carries out a convolution calculation of this tap coefficient given by the diffraction removing coefficient and the input signal. In the above initial status, this calculation delays the input signal by a given time and outputs the signal as it is.

Updater 1202 detects a diffraction component from the input signal and the diffraction removed signal, and estimates a coefficient that can remove the detected diffraction component. To be more specific, updater 1202 can detect the diffraction component by using a correlation signal obtained between the diffraction removed signal and a delayed input signal which is delayed by a given time. This is because the diffraction component can be found using a correlation function of the input signal. Phases are adjusted using the diffraction component thus obtained, the input signal and removing signal, and then the diffraction removing coefficient is estimated, which is supplied to diffraction removing calculator 1201 and updated in calculator 1201.

Similar to propagation distortion compensator 1150 shown in FIG. 11, the nonlinear distortion compensating device in accordance with this third embodiment includes diffraction remover 1250 in addition to the structure described in the first embodiment. In an environment where diffraction may occurs, the structure of the third embodiment can output quality signals not degraded by the diffraction.

Figure 13:
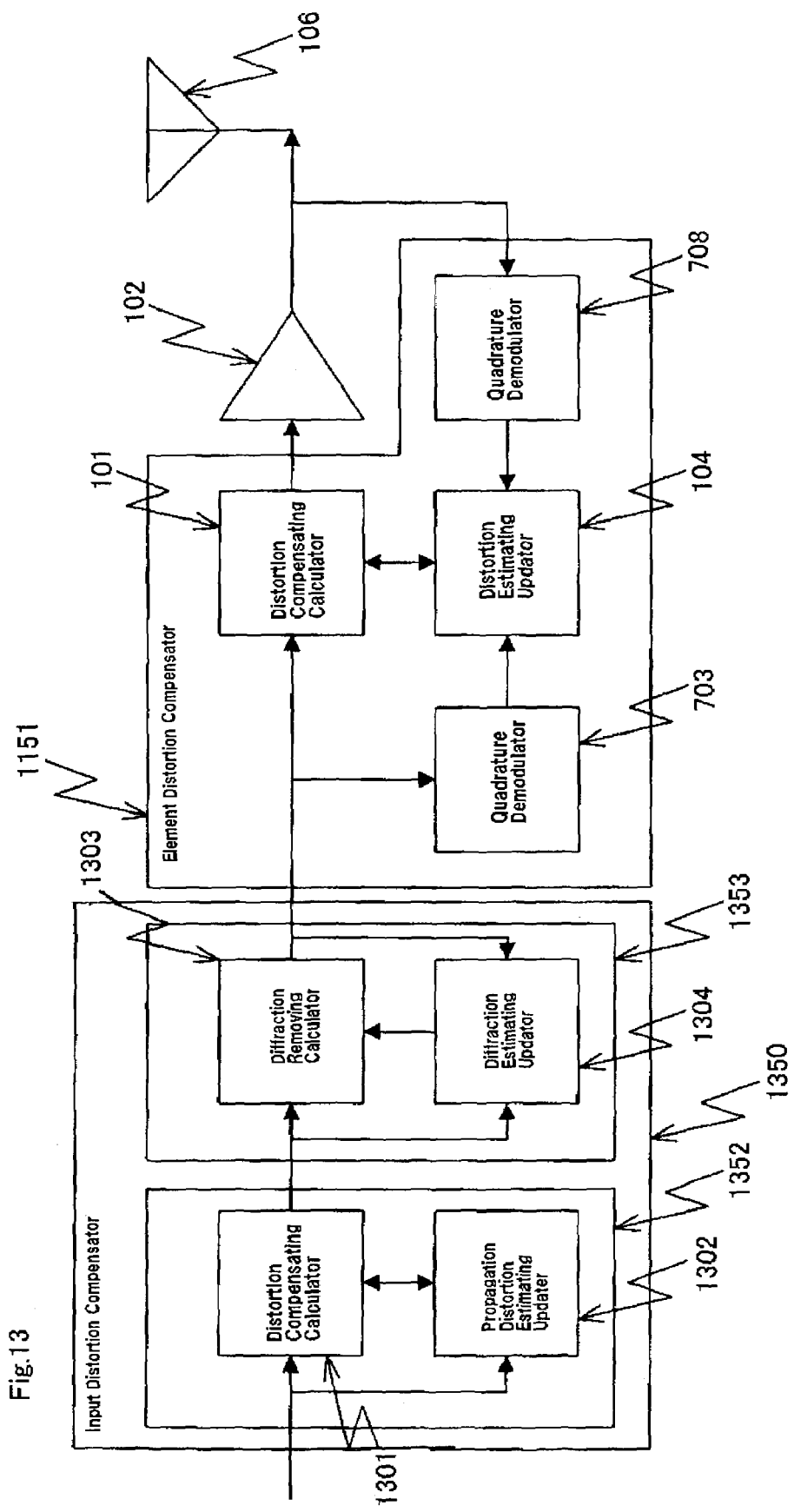
FIG. 13 is a block diagram showing still another nonlinear distortion compensating device in accordance with the third exemplary embodiment of the present invention.

Meanwhile, both of propagation distortion compensator 1150 shown in FIG. 11 and diffraction remover 1250 shown in FIG. 12 can be used in the same device. FIG. 13 shows a structure of such a case. The structure shown in FIG. 13 comprises the following elements:

propagation distortion compensator 1352 for compensating an input signal for distortion due to the propagation, and outputting a propagation-distortion compensated signal;

diffraction remover 1353 for removing a diffraction component from the propagation-distortion compensated signal, and outputting a diffraction removed signal;

element-distortion compensator 1151 for estimating distortion generated by amplifier 102 from both the diffraction removed signal and the output signal, and outputting a distortion compensating signal formed of the diffraction removed signal plus inverse characteristics corresponding to the estimated distortion;

amplifier 102 for amplifying the distortion compensated signal and outputting the amplified signal; and antenna 106 for radiating the output signal to the air.

Since both of propagation distortion compensator 1352 and diffraction remover 1353 compensate for the distortion component (e.g. a propagation distortion component and a diffraction component) included in the input signal, they can be integrated as input distortion compensator 1350. Also, both of them have similar elements to each other, thus parts of the operations such as the convolution calculation carried out in distortion compensating calculator 1301 and diffraction removing calculator 1303, and the correlation processes carried out in propagation distortion estimating updater 1302 and diffraction estimating updater 1304 can be shared with both of compensator 1352 and remover 1353. Those elements can be time-shared, which results in the same as the independently processed result.

This structure includes input-distortion compensator 1350 in addition to the nonlinear distortion compensating device described in FIG. 7. Compensator 1350 is formed of propagation distortion compensator 1150 shown in FIG. 11 and diffraction remover 1250 shown in FIG. 12. Therefore, those elements operate in the same way as discussed already, and the detailed descriptions thereof are omitted.

The foregoing structure allows eliminating multi-path distortion, fading distortion, or adverse influence due to diffraction existing in an input signal. Input distortion compensator 1350 can share parts of the constituent elements such as propagation distortion compensator 1352 and diffraction remover 1353. Thus a simple circuit structure can produce a high efficiency. If the distortion components included in an input signal are limited by an operational environment, the functions of input distortion compensator 1350 can be reduced accordingly.

In the foregoing description, one of tap coefficients is set at 1.0 as an initial value, and the others are set at 0.0. The initial values are not limited to those values, and in the case of a known environment, a tap coefficient adaptive to the environment can be used. If an environment changes little, a fixed tap coefficient can be used, so that respective estimating updaters are not needed and the structure can be more simplified.

Input distortion compensator 1350 shown in FIG. 13 is described such that compensator 1350 firstly compensates for the propagation distortion, then removes the diffraction; however, this order can be reversed, i.e., the diffraction removal is carried out first, and then the propagation-distortion can be compensated.

4. Fourth Exemplary Embodiment

An input distortion compensator is prepared on a front stage of the nonlinear distortion compensating device shown in FIG. 8. This structure is described hereinafter as the fourth embodiment with reference to FIG. 14.

Input distortion compensator 1450 comprises the following elements:

(a) propagation distortion compensator 1452 including:

(a-1) distortion compensating calculator 1401 for outputting a propagation distortion compensated signal which is compensated for a diffraction distortion component of the input signal using a propagation distortion compensating coefficient; and (a-2) propagation distortion estimating updater 1402 for receiving the input signal and detection information supplied from demodulator 103, estimating propagation-distortion, and outputting and updating a propagation-distortion compensating coefficient that can compensate for the estimated propagation-distortion; and (b) diffraction remover 1453 including:

(b-1) diffraction removing calculator 1403 for receiving the propagation distortion compensated signal and the diffraction removing coefficient, and outputting a diffraction removed signal that removes a diffraction component from the propagation distortion compensated signal;

(b-2) diffraction estimating updater 1404 for receiving the propagation distortion compensated signal and the detection information supplied from demodulator 103, estimating a diffraction component, and outputting a diffraction removing coefficient that removes the estimated diffraction component.

Element distortion compensator 1151 includes demodulator 103, which receives the diffraction removed signal and then provides the signal with demodulation and detection, thereby outputting the resultant signal as a detection signal. At the same time, demodulator 103 also outputs a receiving status obtained from the demodulation and detection as detection information. The receiving status includes, e.g., information about a frequency error, timing synchronizing error, phase, amplitude, electric power, and error detection. Other structures remain unchanged as the nonlinear distortion compensating device shown in FIG. 8.

Propagation distortion estimating updater 1402 and diffraction estimating updater 1404 produce tap coefficients such that the initial value of one tap coefficient is 1.0 and others are 0.0, and output the coefficients as propagation distortion compensating coefficients and diffraction removing coefficients respectively to distortion compensating calculator 1401 and diffraction removing calculator 1403, where the coefficients are updated. Calculators 1401 and 1403 carry out the convolution calculation of the respective input signals to calculators 1401, 1403 and the coefficients supplied from the respective estimating updaters, then output a propagation distortion compensated signal and diffraction removed signal respectively. In the initial status, each input signal is delayed by a given time, then they are input.

Propagation distortion estimating updater 1402 estimates a propagation distortion amount from an input signal and calculates a propagation distortion compensating coefficient that compensates for the estimated distortion amount; however, updater 1402 temporarily holds the calculation result, and determines whether or not to output and update it to calculator 1401 in response to detection information supplied from demodulator 103. For instance, a poor receiving status or a bad receiving environment is expected due to the following facts: errors are detected, a frequency error or synchronization error exists, a phase or amplitude is far out of an ideal value, gain information is small. In such a condition, it is difficult to obtain an accurate propagation distortion from an input signal. Even if a propagation distortion compensating coefficient is calculated and updated out of consideration for the foregoing condition, the communication system is adversely and seriously influenced by the errors and wrong propagation. In order to avoid such an adverse influence to the system, updater 1402 outputs and updates the propagation coefficient compensating coefficient only when it is determined, based on various information included in the detection information, that the coefficient can be obtained at a given accuracy.

In a similar way, only when the diffraction removing coefficient can be obtained at a given accuracy, the coefficient is output and updated by updater 1404. As such, the operation is controlled in response to the environment, so that a device which is required to operate in a stable manner such as a relay device can maintain high accuracy and stable operation.

The timings when updaters 1402 and 1404 update the coefficients can be selected, using the timing synchronizing information contained in the detection information supplied from demodulator 103, such that changes of the coefficients do not adversely affect communication signals as the switch timings of symbols and bursts do not influence the signals. This timing selection can maintain the communication of a high quality.

This fourth embodiment can split the device into input distortion compensator 1450 and element distortion compensator 1151, so that functions additionally required can be added. This method of building a device can achieve a lower cost. An input signal received by demodulator 103 has been removed a distortion component by input distortion compensator 1450 disposed before demodulator 103, which is thus to demodulate the stable signal free from the influence of the propagation environment or diffraction status. As a result, the performance of demodulator 103 can be more stable and accurate.

In this fourth embodiment, propagation distortion estimating updater 1402 estimates, based on an input signal, a propagation distortion compensating coefficient, and diffraction estimating updater 1404 estimates, based on the propagation distortion compensating coefficient, a diffraction removing coefficient. However, the resultant diffraction removed signal still includes residual errors which have been found by both updaters 1402 and 1404. There is thus another way to estimate the foregoing coefficients: the reference base-band signal supplied from base-band modulator 804 is fed into updaters 1402 and 1404 in response to the detection result obtained from demodulator 103 (refer to signal 1455 shown with a broken line in FIG. 14), so that the foregoing two coefficients can be estimated from the difference between the diffraction removed signal and the reference base-band signal. Therefore, not only the estimation from the input signal but also the removal of the residual errors from the compensated signals are available, thus a more accurate process can be expected.

Next, another embodiment is described hereinafter with reference to FIG. 15, where input compensator 1450 carries out an estimation and an updating with an input signal, detection information about the input signal, and a demodulated signal obtained from the detection information.

Figure 15:
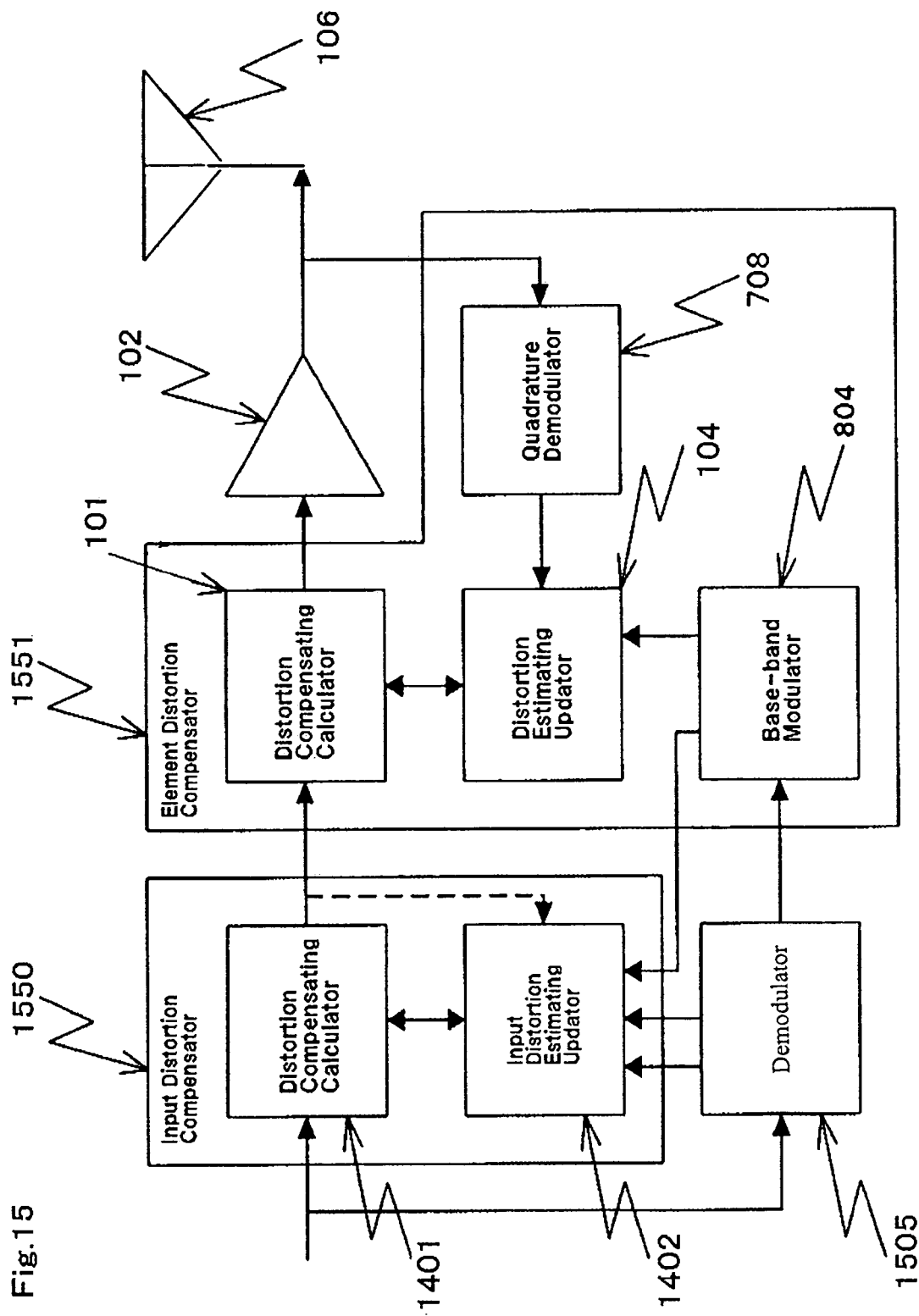
FIG. 15 is a block diagram showing another nonlinear distortion compensating device in accordance with the fourth exemplary embodiment of the present invention.

FIG. 15 shows a nonlinear distortion compensating device comprises the following elements:

input compensator 1550 for compensating an input signal for a distortion component, and outputting an input distortion compensated signal;

demodulator 1505 for detecting the input signal, and outputting detection information as well as a detection result;

element distortion compensator 1551 for estimating distortion of amplifier 102 from the input distortion compensated signal, the detection result and the output signal, and outputting an element distortion compensated signal formed of the input distortion compensated signal plus reversal characteristics corresponding to the estimated distortion;

amplifier 102 for amplifying the element distortion compensated signal, and outputting the amplified signal; and antenna 106 for radiating the output signal as electromagnetic wave.

Figure 14:
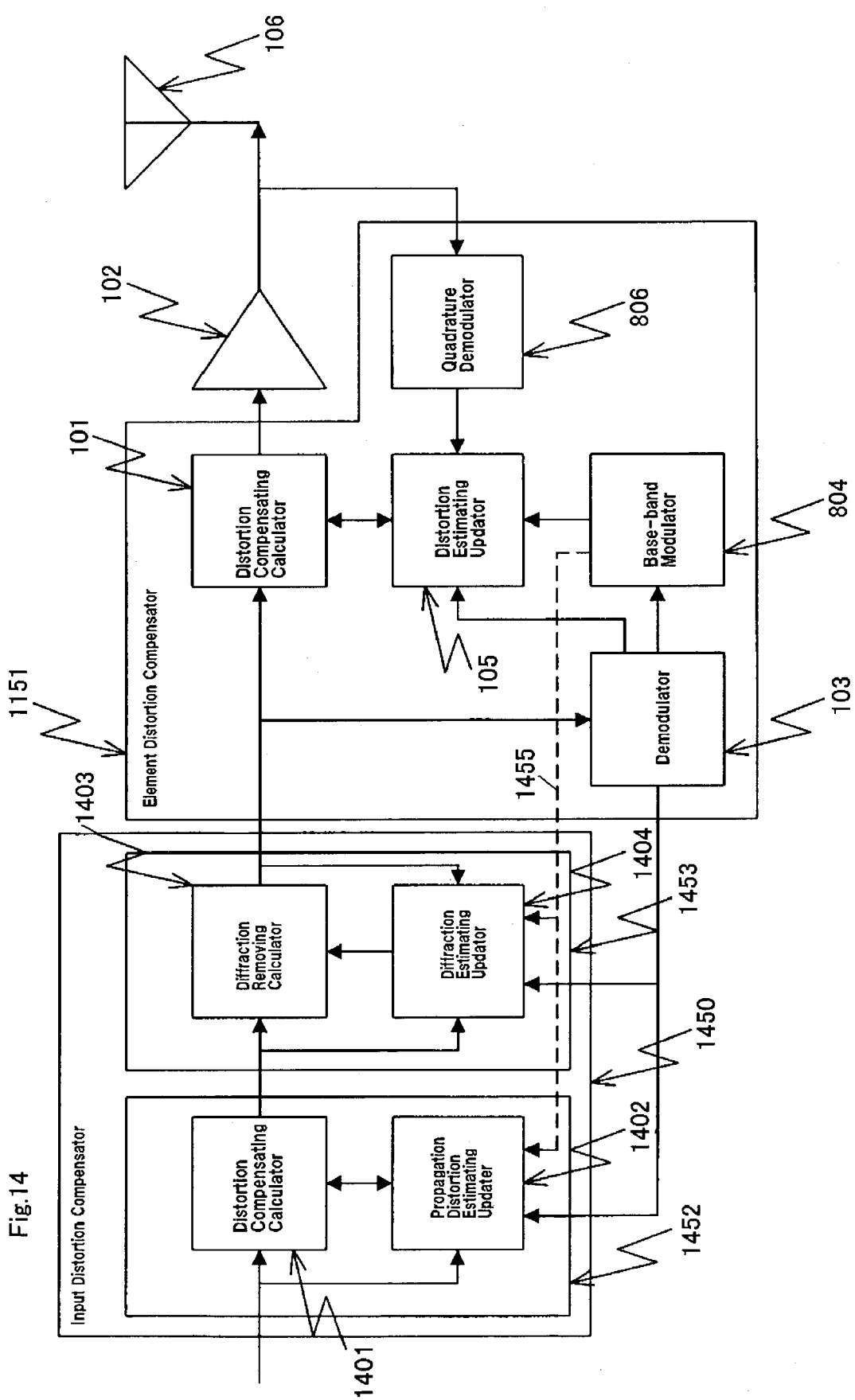
FIG. 14 is a block diagram showing a nonlinear distortion compensating device in accordance with a fourth exemplary embodiment of the present invention.

The structure shown in FIG. 15 replaces propagation distortion compensator 1452 and diffraction remover 1453 shown in FIG. 14 with input distortion compensator 1550, and an input to demodulator 1505 is replaced with an input signal. The operation is basically taken over from FIG. 14 to FIG. 15, so that only the differences are described hereinafter.

Demodulator 1505 demodulates, detects and quadrature-demodulates an input signal, and outputs the resultant input base-band signal. At the same time, it outputs detection information including the information about the frequency, timing synchronization, phase, amplitude, electric power, error-detection, those detected at the detection. It also outputs the detection result as a data stream. Base-band modulator 804 takes in the data stream supplied from demodulator 1505, and re-modulates the detected signal following the demodulating method of the input signal, and outputs a reference base-band signal, i.e., a demodulated signal of the input signal.

Input distortion estimating updater 1402 receives the input base-band signal (or the input distortion compensated signal shown with a broken line in FIG. 15), the detection information and the reference side-band signal, and removes multi-path distortion, fading distortion, or a distortion component formed mainly of diffraction component, from the input signal. To be more specific, a distortion component is estimated from the difference between the input base-band signal and the reference base-band signal, or an estimating calculation can be done using the input distortion compensated signal which is formed by removing the distortion component from the reference base-band signal and the input signal.

Since there is no mathematical difference between the case using the input signal and the case using the input distortion compensated signal, a selection of the cases can depend on a structure of the device. The input distortion component thus obtained introduces an input distortion compensating coefficient corresponding thereto. This coefficient is fed into distortion compensating calculator 1401 based on the detection information, and then updated. Calculator 1401 provides the input distortion compensating coefficient and the input signal with a convolution calculation, and outputs the input distortion compensated signal. After this process, the process of compensating for the element distortion previously discussed is carried out.

The foregoing structure allows demodulator 1505 to carry out demodulation and detection based on an input signal and independent of input distortion compensator 1550. As a result, a stable demodulation can be expected even in an initial stage where an estimated result is subject to change, or in the case where an environment tends to change. At the same time, in the structure shown in FIG. 15, a delay due to input distortion compensator 1550 is eliminated, so that a faster updating speed can be expected, though in the structure shown in FIG. 14, the estimation is carried out in the condition where a delay due to input distortion compensator 1450 plus a delay due to demodulator 103 are available.

Figure 16:
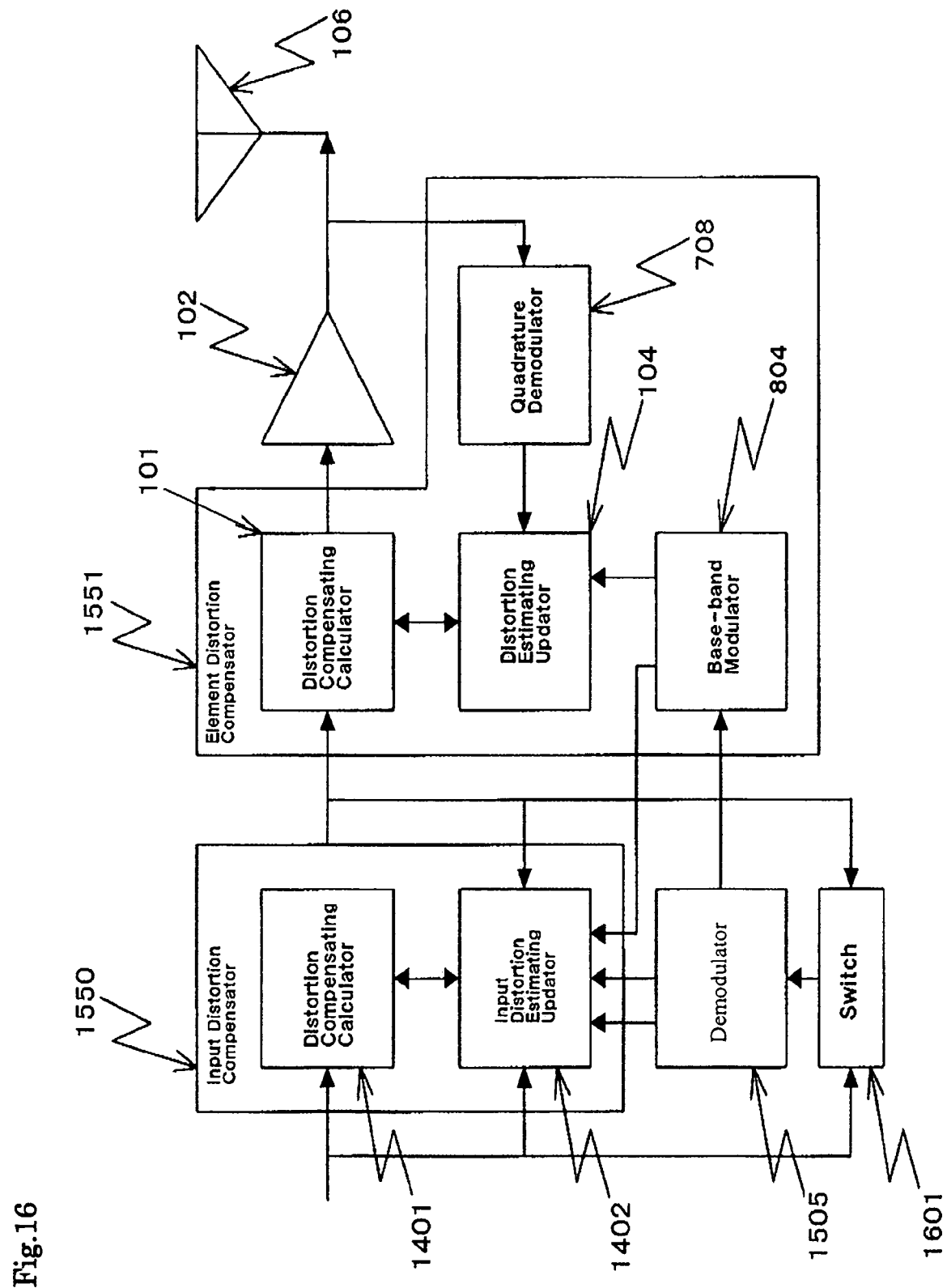
FIG. 16 is a block diagram showing still another nonlinear distortion compensating device in accordance with the fourth exemplary embodiment of the present invention.

As shown in FIG. 16, switch 1601 is prepared in an input stage of demodulator 1505 for switching the input signal and the input distortion compensated signal before supplying either one of them to demodulator 1505. This structure allows using an input signal in the initial stage or a drastically changing status, and switching to an input distortion compensated signal when the status turns stable.

5. Fifth Exemplary Embodiment

Figure 17:
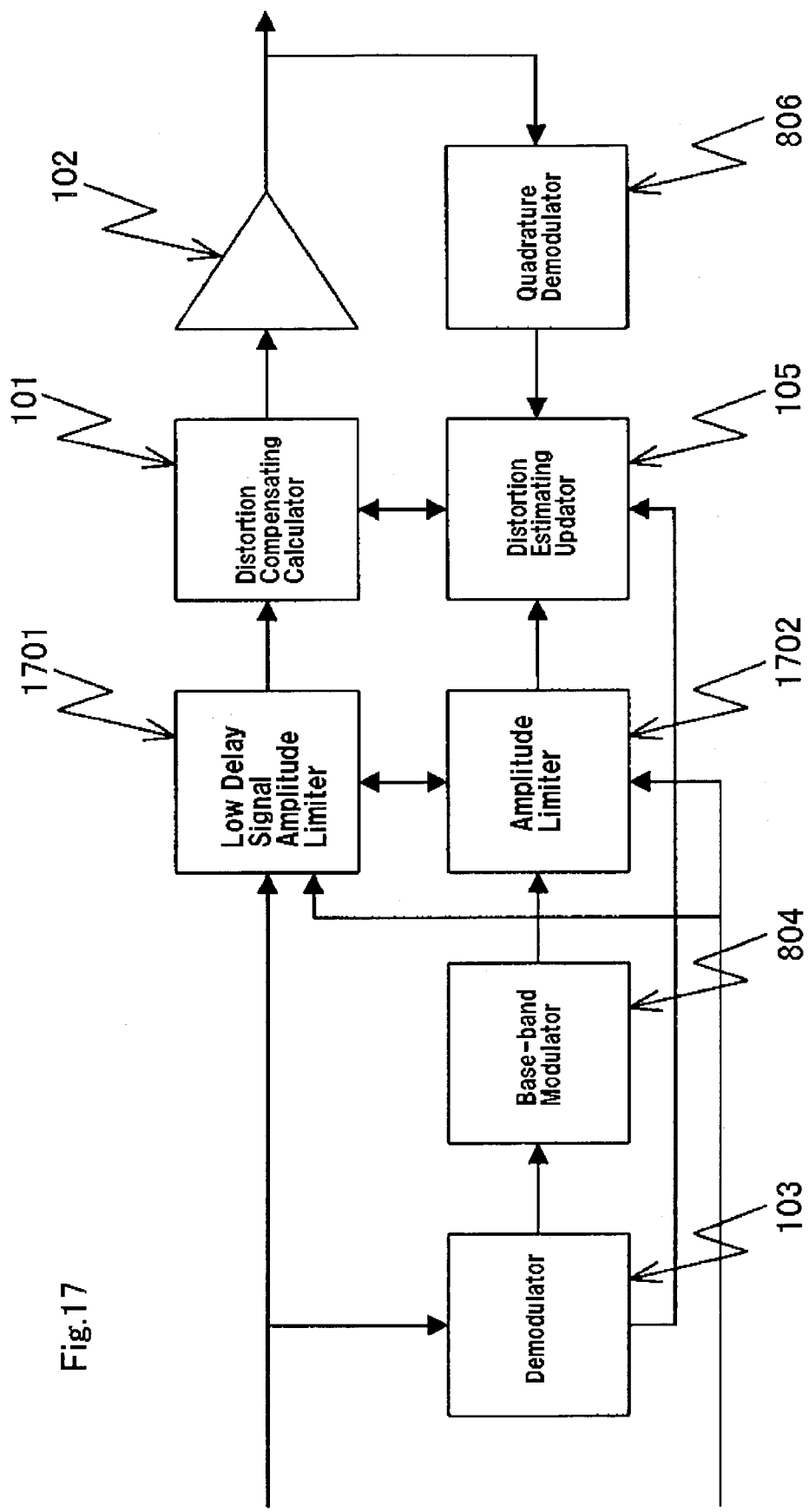
FIG. 17 is a block diagram showing a nonlinear distortion compensating device in accordance with a fifth exemplary embodiment of the present invention.

A nonlinear distortion compensating device additionally equipped with a signal amplifier is demonstrated in the fifth exemplary embodiment with reference to FIG. 17, in which elements similar to those in FIG. 8 have the same reference marks. Low delay signal amplitude limiter 1701 receives an input signal and a control signal, and outputs those signals with their amplitudes limited and with a little delay. It also outputs the characteristics which limit the amplitudes as amplitude limiting characteristics information. Signal amplitude limiter 1702 receives a reference base-band signal, the control signal and the amplitude limiting characteristics information, and outputs an amplitude limiting reference signal which limits a signal amplitude of the reference base-band signal.

Different operations from those described in FIG. 8 are demonstrated hereinafter. An input signal is firstly fed into low-delay signal amplitude limiter 1701, which limits the amplitude of the input signal based on control information with a little delay. At this time, in order to minimize a delay due to the process, nonlinear analog elements can be used for limiting the amplitudes of the signals, or the signals can be digitally processed using a predetermined amplitude-limiting table or an amplitude limiting calculation. The amplitude limiting process becomes a factor in degrading a spectrum or a modulation accuracy with respect to an input signal, so that this degradation should be small enough not to adversely affect the system.

The control information includes the information about an output power and an input power. Thus an accurate and highly efficient device can be achieved such that an amplitude amount of a signal can be adjusted in response to the power, where an amplitude of the signal is limited depending on a distortion component produced in amplifier 102. An amplitude limited input signal and corresponding amplitude limiting characteristics information are thus output. Distortion compensating calculator 101 estimates a distortion component produced by amplifier 102 from the amplitude limited input signal, and outputs an element distortion compensating signal including reversal characteristics to the estimated distortion.

The element distortion compensating signal is added distortion by amplifier 102; however the characteristics added in advance cancels the distortion, so that the amplitude limited input signal is output. This input signal is limited in its amplitude but includes distortion; however, as discussed above, this input signal is designed not to adversely affect the system.

On the other hand, the input signal is fed into demodulator 103, where the input signal is demodulated and detected. The result of those processes are fed into base-band modulator 804 and become a reference base-band signal, which is then fed into signal amplitude limiter 1702. Limiter 1702 provides, based on the control information and the amplitude limiting characteristics information supplied from limiter 1701, the reference base-band signal with the same process that has been done in limiter 1701. This process is not necessarily the same process as limiter 1701 has done (equivalent process characteristic-wise is acceptable), however, the process is carried out digitally, so that high accuracy, flexibility, and stableness are obtainable. The signal thus processed is supplied to distortion estimating updater 105 as an amplitude limited reference signal.

Updater 105 estimates the characteristics of distortion produced by amplifier 102 by using the detection information, amplitude limited reference signal, and feedback base-band signal, and outputs an element distortion compensating coefficients corresponding to the estimated characteristics to distortion compensating calculator 101. At this time, the feedback base-band signal undergone the distortion compensation is equivalent to the amplitude limited input signal undergone the amplitude limiting process. Since the amplitude limited reference signal is produced by providing the input signal with an amplitude limiting process, it is understood that a normal control is carried out.

In general, a modulated signal with a lot of information superposed varies drastically in amplitude, so that a greater load is applied to a linear amplifier for obtaining a given output power. However, the signal with such a great amplitude scarcely occurs in the modulated signals. In other words, the linear amplifier consumes surplus power just for such signals that scarcely happen. Therefore, limiting the amplitude improves substantially the power efficiency.

The foregoing embodiment proves that the device, which provides an input signal with the amplitude limiting process, works properly. The amplitude limiting process can be designed in advance. Therefore, the amplitude limiting means is just added to the device, so that the device can work in a more stable manner and more accurately with a simple structure and less power consumption.

Figure 18:
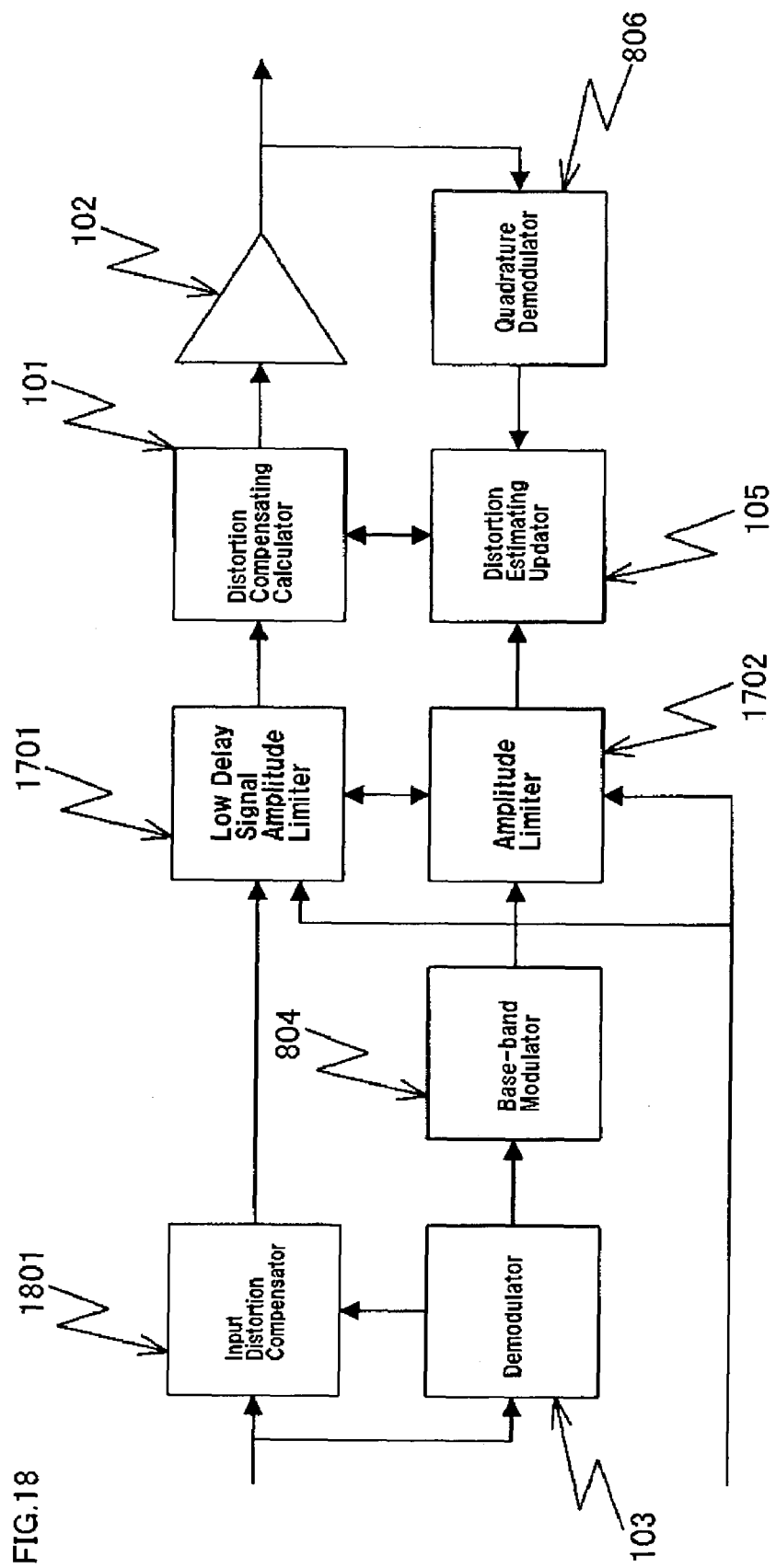
FIG. 18 is a block diagram showing another nonlinear distortion compensating device in accordance with the fifth exemplary embodiment of the present invention.

Next, a structure formed by combining the input distortion compensator, amplitude limiting process with element distortion compensator is described with reference to FIG. 18, which additionally includes input distortion compensator 1801 in the front stage of FIG. 17. Other elements remain unchanged, and only the differences are described hereinafter.

Input distortion compensator 1801 detects an input distortion component formed of propagation distortion and diffraction component from an input signal and the demodulated signal of the input signal, and outputs an input distortion compensated signal. An input signal is firstly fed into input distortion compensator 1801, where its distortion component is detected by comparing the input signal with its demodulated signal, then the input signal is compensated. This operation is equivalent to that described in the third embodiment. Operations thereafter remain unchanged as those described in FIG. 17. The foregoing structure allows the nonlinear distortion compensating device to detect in an input signal the distortion component generated through the propagation path and the diffraction, and to compensate for the distortion component. Therefore, the device of high efficiency and accuracy as well as free from adverse influence of the distortion component is obtainable.

6. Sixth Exemplary Embodiment

Figure 19:
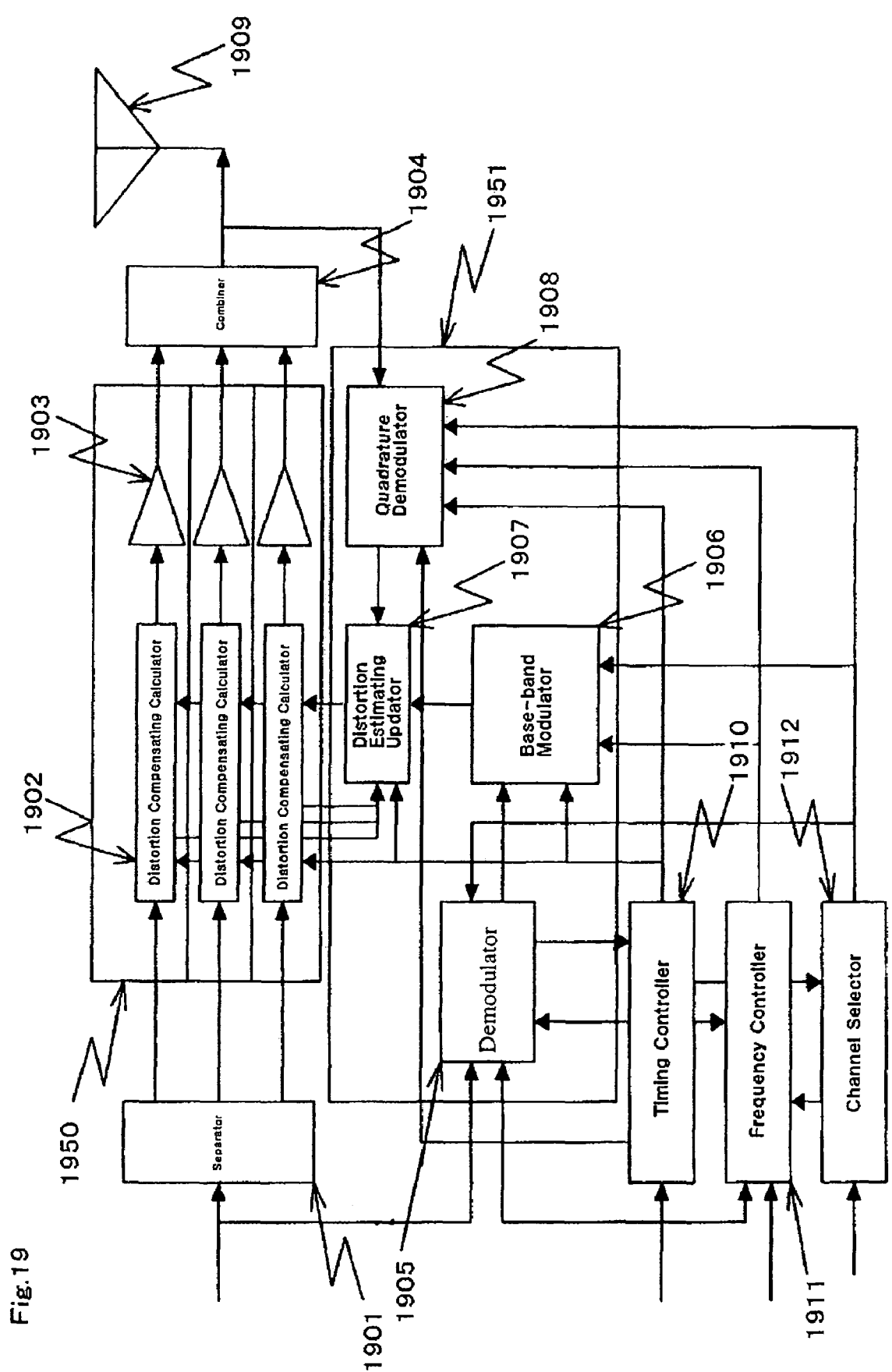
FIG. 19 is a block diagram showing a nonlinear distortion compensating device in accordance with a sixth exemplary embodiment of the present invention.

At least two distortion compensating calculators and at least two amplifiers are disposed in a nonlinear distortion compensating device. This case is demonstrated in the sixth embodiment with reference to FIG. 19, which includes a plurality of the compensation & amplification processes instead of the single process in FIG. 8. Only the differences from the descriptions of FIG. 8 are demonstrated hereinafter.

The nonlinear distortion compensating device in accordance with the sixth embodiment comprises the following elements:

- separator 1901 for separating an input signal in response to the frequency of the input signal, and outputting plural channel-signals;
- compensation & amplification processor 1950 for receiving the channel signal, and outputting the channel signal undergone both of a distortion compensating calculation and then an amplification;
- combiner 1904 for combining the channel signals supplied, and outputting the combined signal;
- timing controller 1910 for receiving detection information from demodulator 1905 and timing information from outside the system, and outputting the timing information to environmentally adapting processor 1951, compensation & amplification processor 1950, frequency controller 1911 and channel selector 1912;
- frequency controller 1911 for receiving frequency information from outside the system, detection information from demodulator 1905, timing information from timing controller 1910;
- channel selector 1912 for receiving channel information from outside the system, and outputting channel selecting information; and
- environmental adapting processor 1951 for estimating distortion from the input signal and the output signal based on the timing information, frequency controlling information and channel selecting information, and updating an estimated value, corresponding to the channel selecting information, of distortion compensating calculator 1902.

Compensation & amplification processor 1950 is formed of distortion compensating calculator 1902 and amplifier 1903, and environmentally adapting processor 1951 is formed of demodulator 1905, base-band modulator 1906, distortion estimating updater 1907 and quadrature demodulator 1908. The basic structure is the same as that shown in FIG. 8.

An overall operation of the nonlinear distortion compensating device thus structure is demonstrated hereinafter. Separator 1901 separates the input signal in response to the frequency into plural channel-signals, and outputs them to amplification & amplification processors 1950, which are prepared to each one of channel signals respectively. Processor 1950 amplifies the channel signal linearly and outputs the output channel signal, which is combined into an output signal before being output from antenna 1909.

The foregoing structure allows limiting the bandwidths of the signals processed by respective amplification & amplification processors, so that the frequency characteristics within the bandwidth in amplifier 1903, which is a major distortion source, can be kept uniform. As a result, the channel signals compensated their distortion and supplied are kept in high quality.

The distortion compensating coefficients used in respective distortion compensating calculators 1902 are adaptively processed in response to a change of the distortion characteristic of amplifier 1903 by environmentally adaptive processor 1951, and the results are to be updated. However, this characteristic varies moderately depending on time, so that the characteristics of compensation & amplification processor 1950 can be updated on time-sharing basis. Therefore, this sixth embodiment can substantially simplify the structure, although the conventional device needs environmentally adapting processors 1951 respectively to each distortion compensating calculator 1902.

Separator 1901 splits channels depending on the frequency of the input signal; however, it can split the channels depending on time, or depending on both of the frequency and time. The time-depending channel-split allows amplifier 1903 to suppress its averaged output power, so that the load is reduced and a longer service life can be expected.

In this sixth embodiment, one compensation & amplification processor 1950 is prepared for each one channel; however, preparation of more numbers of processors 1950 will back up the system when problems happen in the process, so that a more stable system can be expected.

Separator 1901 separates an input signal into channel signals; however, the channel is used for the sake of convenience, and when the distortion is compensated, a minimum unit of divided frequency is referred to as a channel in this embodiment. The channel here thus can be different from a channel relating to a frequency and being used in a communication system.

What is claimed is:

1. A nonlinear distortion compensating device comprising:
    a distortion compensating calculator operable to receive an input signal and a distortion compensating coefficient so that said distortion compensating coefficient is a stored distortion compensating coefficient, and output the input signal with phase distortion and amplitude distortion compensated;
    a demodulator operable to demodulate the input signal and output a demodulated signal;
    a modulator operable to receive the demodulated signal output from the demodulator, modulate the demodulated signal, and output a modulated signal; and
    a distortion estimating updater operable to feed back parts of the signal output from the distortion compensating calculator as a fed back signal, estimate an estimated distortion amount from the fed back signal and the modulated signal output by the modulator, and update the distortion compensating coefficient stored in the distortion compensating calculator based on the estimated distortion amount.

2. The nonlinear distortion compensating device of claim 1 further comprising: a frequency converter for converting the fed back signal into an IF frequency that is lower than a carrier frequency, wherein an IF fed back signal converted by the converter is input to the distortion estimating updater.

3. A nonlinear distortion compensating device comprising:
    a distortion compensating calculator operable to receive an input RF signal and a distortion compensating coefficient so that said distortion compensating coefficient is a stored distortion compensating coefficient, and output the input RF signal with phase distortion and amplitude distortion compensated, wherein the distortion compensating calculator includes:
    a first frequency converter for converting the input RF signal into an IF signal, a buffer for holding the IF signal temporarily, a compensator for calculating distortion compensation using the IF signal supplied from the buffer and the distortion compensating coefficient, a second frequency converter for converting the IF signal with distortion compensated into another RF signal, and a timing controller for determining an output timing of a delayed IF signal following the IF signal supplied from the buffer;

a demodulator operable to demodulate the input RF signal and output a demodulated signal;

a modulator operable to receive the demodulated signal output from the demodulator, modulate the demodulated signal, and output a modulated signal; and a distortion estimating updater operable to feed back parts of the signal output from the distortion compensating calculator as a fed back signal, estimate an estimated distortion amount from the fed back signal and the modulated signal output by the modulator, and update the distortion compensating coefficient stored in the distortion compensating calculator based on the estimated distortion amount.

4. A nonlinear distortion compensating device comprising:

a distortion compensating calculator operable to receive an input signal and a distortion compensating coefficient so that said distortion compensating coefficient is a stored distortion compensating coefficient, and output the input signal with phase distortion and amplitude distortion compensated;

a demodulator operable to demodulate the input signal and output a demodulated signal;

a modulator operable to receive the demodulated signal output from the demodulator, modulate the demodulated signal, and output a modulated signal; and a distortion estimating updater operable to feed back parts of the signal output from the distortion compensating calculator as a fed back signal, estimate an estimated distortion amount from the fed back signal and the modulated signal output by the modulator, and update the distortion compensating coefficient stored in the distortion compensating calculator based on the estimated distortion amount, wherein the demodulator demodulates and detects the input signal, and the modulator modulates the demodulated signal following a modulation method of the input signal based on a result of detection.

5. The nonlinear distortion compensating device of claim 1 further comprising:

a separator operable to separate the input signal into at least two separated signals in response to a frequency of the input signal;

at least two distortion compensating calculators provided for the at least two separated signals, respectively, the at least two distortion compensating calculators each being operable to estimate and compensate a distortion amount of the respective separated signal, and output a respective distortion compensated signal;

at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from the at least two amplifiers.

6. The nonlinear distortion compensating device of claim 1 further comprising:

a separator operable to separate the input signal into at least two separated signals in response to timing of time-sharing the input signal;

at least two distortion compensating calculators provided for the at least two separated signals, respectively, each of the at least two distortion compensating calculators being operable to estimate and compensate a distortion amount of the respective separated signal, and output a respective distortion compensated signal;

at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from each of the at least two amplifiers.

7. A nonlinear distortion compensating device comprising:

a distortion compensating calculator operable to receive an input signal and a distortion compensating coefficient so that said distortion compensating coefficient is a stored distortion compensating coefficient, and output the input signal with phase distortion and amplitude distortion compensated;

a demodulator operable to demodulate the input signal and output a demodulated signal;

a modulator operable to receive the demodulated signal output from the demodulator, modulate the demodulated signal, and output a modulated signal;

a distortion estimating updater operable to feed back parts of the signal output from the distortion compensating calculator as a fed back signal, estimate an estimated distortion amount from the fed back signal and the modulated signal output by the modulator, and update the distortion compensating coefficient stored in the distortion compensating calculator based on the estimated distortion amount; and a channel controller for updating the distortion compensating coefficient stored in the distortion compensating calculator with respect to a signal of a channel designated among the input signal.

8. A nonlinear distortion compensating device comprising:

a distortion compensating calculator operable to receive an input signal and a distortion compensating coefficient so that said distortion compensating coefficient is a stored distortion compensating coefficient, and output the input signal with phase distortion and amplitude distortion compensated;

a demodulator operable to demodulate the input signal and output a demodulated signal;

a modulator operable to receive the demodulated signal output from the demodulator, modulate the demodulated signal, and output a modulated signal;

a distortion estimating updater operable to feed back parts of the signal output from the distortion compensating calculator as a fed back signal, estimate an estimated distortion amount from the fed back signal and the modulated signal output by the modulator, and update the distortion compensating coefficient stored in the distortion compensating calculator based on the estimated distortion amount; and a channel controller for updating contents stored in an input distortion compensating calculator and an element distortion compensating calculator.

9. A nonlinear distortion compensating device comprising:
- a distortion compensating calculator operable to receive an input signal and a distortion compensating coefficient so that said distortion compensating coefficient is a stored distortion compensating coefficient, and output the input signal with phase distortion and amplitude distortion compensated;
- a first quadrature demodulator for converting the input signal into an input base-band signal;
- a second quadrature demodulator for feeding back parts of the signal output from the distortion compensating calculator as a fed back signal, and converting the fed back signal into a feedback base-band signal; and
- a distortion estimating updater operable to estimate an estimated distortion amount from the input base-band signal and the feedback base-band signal, and to update the distortion compensating coefficient stored in the distortion compensating calculator based on the estimated distortion amount.

10. The nonlinear distortion compensating device of claim 9 further comprising:
- a separator operable to separate the input signal into at least two separated signals in response to a frequency of the input signal;
- at least two distortion compensating calculators provided for the at least two separated signals, respectively, each of the at least two distortion compensating calculators being operable to estimate and compensate for a distortion amount of the respective separated signal, and output a respective distortion compensated signal;
- at least two amplifiers provided for the at least two distortion compensating calculators, respectively, each of the at least two amplifiers being operable to receive and amplify the respective distortion compensated signal, and output an amplified signal; and
- a combiner operable to receive and combine the amplified signals output from the at least two respective amplifiers.

11. A nonlinear distortion compensating device comprising:
- a distortion compensating calculator operable to receive an input signal and a distortion compensating coefficient so that said distortion compensating coefficient is a stored distortion compensating coefficient, and output the input signal with phase distortion and amplitude distortion compensated;
- a first quadrature demodulator for converting the input signal into an input base-band signal;
- a second quadrature demodulator for feeding back parts of the signal output from the distortion compensating calculator as a fed back signal, and converting the fed back signal into a feedback base-band signal;
- a distortion estimating updater operable to estimate an estimated distortion amount from the input base-band signal and the feedback base-band signal, and to update the distortion compensating coefficient stored in the distortion compensating calculator based on the estimated distortion amount; and
- a separator for separating the input signal into at least two signals in response to timing of time-sharing the input signal.

12. A nonlinear distortion compensating device comprising:
- a distortion compensating calculator operable to receive an input signal and a distortion compensating coefficient so that said distortion compensating coefficient is a stored distortion compensating coefficient, and output the input signal with phase distortion and amplitude distortion compensated;
- a first quadrature demodulator for converting the input signal into an input base-band signal;
- a second quadrature demodulator for feeding back parts of the signal output from the distortion compensating calculator as a fed back signal, and converting the fed back signal into a feedback base-band signal;
- a distortion estimating updater operable to estimate an estimated distortion amount from the input base-band signal and the feedback base-band signal, and to update the distortion compensating coefficient stored in the distortion compensating calculator based on the estimated distortion amount; and
- a channel controller for updating the distortion compensating coefficient stored in the distortion compensating calculator, the coefficient being assigned to a signal of a channel selected from the input signal.

13. A nonlinear distortion compensating device comprising:
- a distortion compensating calculator operable to receive an input signal and a distortion compensating coefficient so that said distortion compensating coefficient is a stored distortion compensating coefficient, and output the input signal with phase distortion and amplitude distortion compensated;
- a first quadrature demodulator for converting the input signal into an input base-band signal;
- a second quadrature demodulator for feeding back parts of the signal output from the distortion compensating calculator as a fed back signal, and converting the fed back signal into a feedback base-band signal;
- a distortion estimating updater operable to estimate an estimated distortion amount from the input base-band signal and the feedback base-band signal, and to update the distortion compensating coefficient stored in the distortion compensating calculator based on the estimated distortion amount; and
- a channel controller for updating contents stored in an input distortion compensating calculator and an element distortion compensating calculator.

14. A nonlinear distortion compensating device comprising:
- a distortion compensating calculator for receiving an input signal and a distortion compensating coefficient so that said distortion compensating coefficient is a stored distortion compensating coefficient, and outputting the input signal with phase distortion and amplitude distortion compensated;
- a demodulator for demodulating the input signal;
- a base-band modulator for modulating the demodulated signal into a reference base-band signal;
- a quadrature demodulator for feeding back parts of the signal output from the distortion compensating calculator as a fed back signal, and converting the fed back signal into a feedback base-band signal; and
- a distortion estimating updater for estimating an estimated distortion amount from the reference base-band signal and the feedback base-band signal, and updating the distortion compensating coefficient stored in the distortion compensating calculator.

15. The nonlinear distortion compensating device of claim 14, wherein the demodulator demodulates and detects the input signal, and the modulator modulates the demodulated signal following a modulation method of the input signal based on a result of detection.

16. The nonlinear distortion compensating device of claim 14 further comprising:
a separator operable to separate the input signal into at least two separated signals in response to a frequency of the input signal;
at least two distortion compensating calculators provided for the at least two separated signals, respectively, each of the at least two distortion compensating calculators being operable to estimate and compensate a distortion amount of the respective separated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and
a combiner operable to receive and combine the amplified signals output from each of the at least two amplifiers.

17. The nonlinear distortion compensating device of claim 14 further comprising a separator for separating the input signal into at least two signals in response to timing of time-sharing the input signal.

18. The nonlinear distortion compensating device of claim 14 further comprising: a channel controller for updating the distortion compensating coefficient, the coefficient being assigned to a signal of a channel selected from the input signal.

19. The nonlinear distortion compensating device of claim 14 further comprising a channel controller for updating contents stored in an input distortion compensating calculator and an element distortion compensating calculator.

20. A nonlinear distortion compensating device comprising:
a distortion compensating calculator for receiving an input signal and a distortion compensating coefficient so that said distortion compensating coefficient is a stored distortion compensating coefficient, and outputting the input signal with phase distortion and amplitude distortion compensated;
a demodulator for demodulating the input signal;
a base-band modulator for modulating the demodulated input signal into a reference base-band signal;
a quadrature demodulator for feeding back parts of the signal output from the distortion compensating calculator as a fed back signal, and converting the fed back signal into a feedback base-band signal; and
a distortion estimating updater for estimating an estimated distortion amount from the reference base-band signal, the feedback base-band signal and frequency-error information, and updating the distortion compensating coefficient stored in the distortion compensating calculator; and
a frequency estimating controller for estimating a frequency error from the demodulated input signal, and controlling respective frequencies of the demodulator and the quadrature demodulator.

21. The nonlinear distortion compensating device of claim 20, wherein the demodulator demodulates and detects the input signal, and the modulator modulates the demodulated input signal following a modulation method of the input signal based on a result of detection.

22. The nonlinear distortion compensating device of claim 20 further comprising:
a separator operable to separate the input signal into at least two separated signals in response to a frequency of the input signal;
at least two distortion compensating calculators provided for the at least two separated signals, respectively, each of the at least two distortion compensating calculators being operable to estimate and compensate for a distortion amount of the respective separated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and
a combiner operable to receive and combine the amplified signals output from each of the at least two amplifiers.

23. The nonlinear distortion compensating device of claim 20 further comprising a separator for separating the input signal into at least two signals in response to timing of time-sharing the input signal.

24. The nonlinear distortion compensating device of claim 20 further comprising: a channel controller for updating the distortion compensating coefficient, the coefficient being assigned to a signal of a channel selected from the input signal.

25. The nonlinear distortion compensating device of claim 20 further comprising a channel controller for updating contents stored in an input distortion compensating calculator and an element distortion compensating calculator.

26. A nonlinear distortion compensating device comprising:
a propagation distortion compensator for estimating an estimated propagation distortion from an input signal, compensating the estimated propagation distortion and outputting a propagation distortion compensated signal; and
an element distortion compensator comprising:
a distortion compensating calculator operable to receive the propagation distortion compensated signal and a distortion compensating coefficient, and output the propagation distortion compensated signal with phase distortion and amplitude distortion compensated;
a first quadrature demodulator for converting the propagation distortion compensated signal into a base-band signal of the propagation distortion compensated signal;
a second quadrature demodulator for feeding back parts of the signal output from the distortion compensating calculator as a fed back signal, and converting the fed back signal into a feedback base-band signal; and
a distortion estimating updater operable to estimate an estimated distortion amount from the base-band signal of the propagation distortion compensated signal and the feedback base-band signal, and to update the distortion compensating coefficient based on the estimated distortion amount.

27. The nonlinear distortion compensating device of claim 26 further comprising:
a separator operable to separate the input signal into at least two separated signals in response to a frequency of the input signal;
at least two distortion compensating calculators provided for the at least two separated signals, respectively, each of the at least two distortion compensating calculators being operable to estimate and compensate a distortion amount of the respective separated signal, and output a respective distortion compensated signal;

at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from each of the at least two amplifiers.

28. A nonlinear distortion compensating device comprising:

a propagation distortion compensator for estimating an estimated propagation distortion from an input signal, compensating the estimated propagation distortion and outputting a propagation distortion compensated signal; and an element distortion compensator comprising:

a distortion compensating calculator operable to receive the propagation distortion compensated signal and a distortion compensating coefficient, and output the propagation distortion compensated signal with phase distortion and amplitude distortion compensated;

a first quadrature demodulator for converting the propagation distortion compensated signal into a base-band signal of the propagation distortion compensated signal;

a second quadrature demodulator for feeding back parts of the signal output from the distortion compensating calculator as a fed back signal, and converting the fed back signal into a feedback base-band signal;

a distortion estimating updater operable to estimate an estimated distortion amount from the base-band signal of the propagation distortion compensated signal and the feedback base-band signal, and to update the distortion compensating coefficient based on the estimated distortion amount; and a separator for separating the input signal into at least two separated signals in response to timing of time-sharing the input signal.

29. A nonlinear distortion compensating device comprising:

a propagation distortion compensator for estimating an estimated propagation distortion from an input signal, compensating the estimated propagation distortion and outputting a propagation distortion compensated signal; and an element distortion compensator comprising:

a distortion compensating calculator operable to receive the propagation distortion compensated signal and a distortion compensating coefficient, and output the propagation distortion compensated signal with phase distortion and amplitude distortion compensated;

a first quadrature demodulator for converting the propagation distortion compensated signal into a base-band signal of the propagation distortion compensated signal;

a second quadrature demodulator for feeding back parts of the signal output from the distortion compensating calculator as a fed back signal, and converting the fed back signal into a feedback base-band signal;

a distortion estimating updater operable to estimate an estimated distortion amount from the base-band signal of the propagation distortion compensated signal and the feedback base-band signal, and to update the distortion compensating coefficient based on the estimated distortion amount; and a channel controller for updating the distortion compensating coefficient of the distortion compensating calculator, the coefficient being assigned to a signal of a channel selected from the input signal.

30. A nonlinear distortion compensating device comprising:

a propagation distortion compensator for estimating an estimated propagation distortion from an input signal, compensating the estimated propagation distortion and outputting a propagation distortion compensated signal; and an element distortion compensator comprising:

a distortion compensating calculator operable to receive the propagation distortion compensated signal and a distortion compensating coefficient, and output the signal propagation distortion compensated signal with phase distortion and amplitude distortion compensated;

a first quadrature demodulator for converting the propagation distortion compensated signal into a base-band signal of the propagation distortion compensated signal;

a second quadrature demodulator for feeding back parts of the signal output from the distortion compensating calculator as a fed back signal, and converting the fed back signal into a feedback base-band signal;

a distortion estimating updater operable to estimate an estimated distortion amount from the base-band signal of the propagation distortion compensated signal and the feedback base-band signal, and to update the distortion compensating coefficient based on the estimated distortion amount; and a channel controller for updating contents stored in an input distortion compensating calculator and an element distortion compensating calculator.

31. A nonlinear distortion compensating device comprising:

a diffraction remover for estimating an amount of diffraction of an input signal and an output signal, and removing a diffraction component; and an element distortion compensator for estimating distortion of elements from a fed back signal which is formed by feeding back parts of the output signal, and a signal output from the diffraction remover, and outputting an element distortion compensated signal.

32. The nonlinear distortion compensating device of claim 31 further comprising:

a separator operable to separate the input signal into at least two separated signals in response to a frequency of the input signal;

at least two input distortion compensators provided for the at least two separated signals, respectively, each of the at least two input distortion compensators being operable to estimate and compensate an amount of the respective diffraction or propagation distortion of the separated signal, and output a respective input distortion compensating signal;

at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;

at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from the at least two amplifiers.

33. The nonlinear distortion compensating device of claim 31 further comprising a separator for separating the input signal into at least two signals in response to timing of time-sharing the input signal.

34. The nonlinear distortion compensating device of claim 32 further comprising: a channel controller for updating the distortion compensating coefficient, the distortion compensating coefficient being assigned to a signal of a channel selected from the input signal.

35. The nonlinear distortion compensating device of claim 31 further comprising a channel controller for updating contents stored in an input distortion compensating calculator and the element distortion compensator.

36. A nonlinear distortion compensating device comprising:
an input distortion compensator including:
a propagation distortion compensator for estimating an estimated propagation distortion from an input signal, and compensating for the estimated propagation distortion;
a diffraction remover for estimating an amount of diffraction of the input signal and an output signal, and removing a diffraction component; and
an element distortion compensator for estimating an element distortion from a fed back signal, which is formed by feeding back parts of the output signal, and a signal output from the propagation distortion compensator, and outputting an element distortion compensated signal.

37. The nonlinear distortion compensating device of claim 36 further comprising: a base-band modulator for outputting a reference base-band signal formed by providing the input signal with quadrature demodulation, and a fed back base-band signal formed by providing the input signal with quadrature demodulation into the element distortion compensator.

38. The nonlinear distortion compensating device of claim 37, wherein the reference base-band signal is obtained by demodulating, or modulating the input signal.

39. The nonlinear distortion compensating device of claim 36 further comprising:
a separator operable to separate the input signal into at least two separated signals in response to a frequency of the input signal;
at least two input distortion compensators provided for the at least two separated signals, respectively, each of the at least two input distortion compensators being operable to estimate and compensate an amount of the respective diffraction or propagation distortion of the separated signal, and output a respective input distortion compensated signal;
at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from the at least two amplifiers.

40. The nonlinear distortion compensating device of claim 36 further comprising a separator for separating the input signal into at least two signals in response to timing of time-sharing the input signal.

41. The nonlinear distortion compensating device of claim 39 further comprising: a channel controller for updating the distortion compensating coefficient, the distortion compensating coefficient being assigned to a signal of a channel selected from the input signal.

42. The nonlinear distortion compensating device of claim 36, said input distortion compensator and said element distortion compensator includes respective contents for compensating for the estimated propagation distortion and the estimated element distortion, respectively, further comprising a channel controller for updating said respective contents.

43. A nonlinear distortion compensating device comprising:
a demodulator for demodulating an input signal, and outputting a demodulated signal;
a propagation distortion compensator for estimating propagation distortion from the demodulated signal and the input signal, and outputting a propagation distortion compensated signal; and
an element distortion compensator for receiving the propagation distortion compensated signal, estimating an element distortion from a fed back signal formed by feeding back parts of an output signal, the demodulated signal and the propagation distortion compensated signal, and outputting an element distortion compensated signal.

44. The nonlinear distortion compensating device of claim 43 further comprising:
a separator operable to separate the input signal into at least two separated signals in response to a frequency of the input signal;
at least two input distortion compensators provided for the at least two separated signals, respectively, each of the at least two input distortion compensators being operable to estimate and compensate an amount of the respective diffraction or propagation distortion of the separated signal, and output a respective input distortion compensated signal;
at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from the at least two amplifiers.

45. The nonlinear distortion compensating device of claim 43 further comprising a separator for separating the input signal into at least two signals in response to timing of time-sharing the input signal.

46. The nonlinear distortion compensating device of claim 44 further comprising: a channel controller for updating the distortion compensating coefficient, the distortion compensating coefficient being assigned to a signal of a channel selected from the input signal.

47. The nonlinear distortion compensating device of claim 43 further comprising a channel controller for updating contents stored in an input distortion compensating calculator and the element distortion compensating calculator.

48. A nonlinear distortion compensating device comprising:
a demodulator for demodulating an input signal, and outputting a demodulated signal;
a diffraction remover for estimating an amount of diffraction of the input signal and an output signal, and removing a diffraction component; and
an element distortion compensator for receiving an output from the diffraction remover, estimating an element distortion from a fed back signal formed by feeding back parts of an output signal, the demodulated signal and the output from the diffraction remover, and outputting an element distortion compensated signal.

49. The nonlinear distortion compensating device of claim 48 further comprising:
a separator operable to separate the input signal into at least two separated signals in response to a frequency of the input signal;
at least two input distortion compensators provided for the at least two separated signals, respectively, each of the at least two input distortion compensators being operable to estimate and compensate an amount of the respective diffraction or propagation distortion of the separated signal, and output a respective input distortion compensated signal; and
at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and
a combiner operable to receive and combine the amplified signals output from the at least two amplifiers.

50. The nonlinear distortion compensating device of claim 48 further comprising a separator for separating the input signal into at least two signals in response to timing of time-sharing the input signal.

51. The nonlinear distortion compensating device of claim 49 further comprising: a channel controller for updating the distortion compensating coefficient of each respective one of the at least two distortion compensating calculators, the distortion compensating coefficient being assigned to a signal of a channel selected from the input signal.

52. The nonlinear distortion compensating device of claim 48 further comprising a channel controller for updating contents stored in an input distortion compensating calculator and the element distortion compensating calculator.

53. A nonlinear distortion compensating device comprising:
a demodulator for demodulating an input signal, and outputting a demodulated signal;
an input distortion compensator for generating an estimated propagation distortion or an estimated diffraction amount of an output signal from the demodulated signal and the input signal, and outputting an input distortion compensated signal with the estimated propagation distortion compensated or the estimated diffraction amount removed; and
an element distortion compensator for receiving an output from the propagation distortion compensator, estimating an element distortion from a fed back signal formed by feeding back parts of an output signal, the demodulated signal and the input distortion compensated signal, and outputting an element distortion compensated signal.

54. The nonlinear distortion compensating device of claim 53 further comprising:
a separator operable to separate the input signal into at least two separated signals in response to a frequency of the input signal;
at least two input distortion input distortion compensators provided for the at least two separated signals, respectively, each of the at least two input distortion compensators being operable to estimate and compensate an amount of the respective diffraction or propagation distortion of the separated signal, and output a respective input distortion compensated signal;
at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
at least two amplifiers provided for the at least two distortion compensating calculators, respectively, each of the at least two amplifiers being operable to receive and amplify the respective distortion compensated signal, and output an amplified signal; and
a combiner operable to receive and combine the amplified signals output from the at least two amplifiers.

55. The nonlinear distortion compensating device of claim 53 further comprising a separator for separating the input signal into at least two signals in response to timing of time-sharing the input signal.

56. The nonlinear distortion compensating device of claim 54 further comprising: a channel controller for updating the distortion compensating coefficient, the distortion compensating coefficient being assigned to a signal of a channel selected from the input signal.

57. The nonlinear distortion compensating device of claim 53, said input distortion compensator and said element distortion compensator includes respective contents for compensating for the estimated propagation distortion and the estimated element distortion, respectively, further comprising a channel controller for updating said respective contents.

58. A nonlinear distortion compensating device comprising:
- a demodulator for demodulating an input signal and outputting a demodulated signal;
- an element distortion compensator for estimating an element distortion from a fed back demodulated signal formed by feeding back parts of an output signal and demodulating the fed back signal following a reference frequency, the demodulated signal and the input signal, and outputting an element distortion compensated signal;
- a timing controller for controlling a timing of updating an element distortion coefficient based on a reference time supplied by the demodulator; and
- a frequency controller for estimating a frequency error between the input signal and the demodulated signal, and controlling a reference frequency of the demodulator and the element distortion compensator.

59. The nonlinear distortion compensating device of claim 58 further comprising:
- a separator operable to separate the input signal into at least two separated signals in response to a frequency of the input signal;
- at least two input distortion compensators provided for the at least two separated signals, respectively, each of the at least two input distortion compensators being operable to estimate and compensate an amount of the respective diffraction or propagation distortion of the separated signal, and output a respective input distortion compensated signal;
- at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
- at least two amplifiers provided for the at least two distortion compensating calculators, respectively, each of the at least two amplifiers being operable to receive and amplify the respective distortion compensated signal, and output an amplified signal; and
- a combiner operable to receive and combine the amplified signals output from the at least two amplifiers.

60. The nonlinear distortion compensating device of claim 58 further comprising a separator for separating the input signal into at least two signals in response to timing of time-sharing the input signal.

61. The nonlinear distortion compensating device of claim 59 further comprising: a channel controller for updating the distortion compensating coefficient, the distortion compensating coefficient being assigned to a signal of a channel selected from the input signal.

62. The nonlinear distortion compensating device of claim 59, each of said at least two input distortion compensating calculators and said at least two distortion compensating calculators includes respective contents for compensating for the amount of the diffraction or the propagation distortion and for compensating for the distortion amount, respectively, further comprising a channel controller for updating said respective contents.

63. A nonlinear distortion compensating device comprising:
- an element distortion compensating calculator for receiving an input signal with an amplitude limited and an element distortion compensating coefficient, and outputting an element distortion compensated signal;
- a demodulator for demodulating the input signal;
- a base-band modulator for modulating the signal output from the demodulator into a reference base-band signal;
- a signal amplitude limiter for limiting the amplitude of the input signal and an amplitude of the reference base-band signal, and outputting the input signal with the amplitude limited and an amplitude limited reference base-band signal;
- a quadrature demodulator for feeding back parts of an amplified signal as a fed back signal, and converting the fed back signal into a feed back base-band signal; and
- a distortion estimating updater for estimating a distortion amount from the amplitude limited reference base-band signal and the feed back base-band signal, and updating the element distortion compensating coefficient.

64. The nonlinear distortion compensating device of claim 63 further comprising:
- a separator operable to separate the input signal into at least two separated signals in response to a frequency of the input signal;
- at least two input distortion compensators provided for the at least two separated signals, respectively, each of the at least two input distortion compensators being operable to estimate and compensate an amount of the respective diffraction or propagation distortion of the separated signal, and output a respective input distortion compensated signal;
- at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;
- at least two amplifiers provided for the at least two distortion compensating calculators, respectively, each of the at least two amplifiers being operable to receive and amplify the respective distortion compensated signal, and output an amplified signal; and
- a combiner operable to receive and combine the amplified signals output from the at least two amplifiers.

65. The nonlinear distortion compensating device of claim 63 further comprising a separator for separating the input signal into at least two signals in response to timing of time-sharing the input signal.

66. The nonlinear distortion compensating device of claim 64 further comprising: a channel controller for updating the distortion compensating coefficient, the distortion compensating coefficient being assigned to a signal of a channel selected from the input signal.

67. The nonlinear distortion compensating device of claim 63 further comprising a channel controller for updating contents stored in an input distortion compensating calculator and an element distortion compensating calculator.

68. A nonlinear distortion compensating device comprising:
- a demodulator for demodulating an input signal and outputting the demodulated signal;
- an input distortion compensator for estimating an estimated propagation distortion or a diffraction amount of an output signal from the demodulated signal and the input signal, and outputting an input distortion compensated signal with a propagation distortion compensated or a diffraction component removed;

a quadrature demodulator for demodulating a signal formed by feeding back parts of an output signal, and outputting a fed back signal;

a modulator for producing a reference signal from the demodulated signal;

an amplitude limiter for limiting an amplitude of the reference signal or an amplitude of the input distortion compensated signal, and outputting an amplitude limited reference signal or an amplitude limited input distortion compensated signal;

an element distortion compensating calculator for calculating a distortion amount of an element corresponding to the amplitude limited input distortion compensated signal, and outputting an element distortion compensated signal; and an element distortion estimating updater for estimating a distortion amount from the amplitude limited reference signal, the fed back signal and a distortion amount calculated by the element distortion compensating calculator.

69. The nonlinear distortion compensating device of claim 68 further comprising:

a separator operable to separate the input signal into at least two separated signals in response to a frequency of the input signal;

at least two input distortion compensators provided for the at least two separated signals, respectively, each of the at least two input distortion compensators being operable to estimate and compensate an amount of the respective diffraction or propagation distortion of the separated signal, and output a respective input distortion compensated signal;

at least two distortion compensating calculators operable to receive the input distortion compensated signals output by each of the at least two input distortion compensators and a distortion compensating coefficient, each of the at least two distortion compensating calculators being operable to estimate and compensate a distortion amount of the respective separated input distortion compensated signal, and output a respective distortion compensated signal;

at least two amplifiers provided for the at least two distortion compensating calculators, respectively, each of the at least two amplifiers being operable to receive and amplify the respective distortion compensated signal, and output an amplified signal; and a combiner operable to receive and combine the amplified signals output from the at least two amplifiers.

70. The nonlinear distortion compensating device of claim 68 further comprising a separator for separating the input signal into at least two signals in response to timing of time-sharing the input signal.

71. The nonlinear distortion compensating device of claim 69 further comprising: a channel controller for updating the distortion compensating coefficient, the distortion compensating coefficient being assigned to a signal of a channel selected from the input signal.

72. The nonlinear distortion compensating device of claim 68 further comprising a channel controller for updating contents stored in an input distortion compensator and the element distortion compensating calculator.

* * * * *

UNITED STATES PATENT AND TRADEMARK OFFICE
CERTIFICATE OF CORRECTION

| | |
|---|---|
| PATENT NO. | : 7,280,611 B2 |
| APPLICATION NO. | : 10/410323 |
| DATED | : April 9, 2003 |
| INVENTOR(S) | : Masayuki Orihashi et al. |

It is certified that error appears in the above-identified patent and that said Letters Patent is hereby corrected as shown below:

On the Title Page, FIELD [75], Inventors:

"Shinichir Takabayashi" should read -- Shinichiro Takabayashi --.

Signed and Sealed this

Sixth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,280,611 B2
APPLICATION NO. : 10/410323
DATED : October 9, 2007
INVENTOR(S) : Masayuki Orihashi et al.

It is certified that error appears in the above-identified patent and that said Letters Patent is hereby corrected as shown below:

On the Title Page, FIELD [75], Inventors:

"Shinichir Takabayashi" should read -- Shinichiro Takabayashi --.

This certificate supersedes the Certificate of Correction issued May 6, 2008.

Signed and Sealed this

Seventeenth Day of June, 2008

JON W. DUDAS
*Director of the United States Patent and Trademark Office*